United States Patent
Taya et al.

(10) Patent No.: US 7,688,168 B2
(45) Date of Patent: Mar. 30, 2010

(54) ACTUATORS BASED ON FERROMAGNETIC SHAPE MEMORY ALLOY COMPOSITES

(75) Inventors: Minoru Taya, Mercer Island, WA (US);
Victor Cheng, Chandler, AZ (US);
Harry Sugandi, Oakleigh (AU);
Yuanchang Liang, Seattle, WA (US);
Hsiuhung Chen, Seattle, WA (US);
Chi-Yuan Wang, Seattle, WA (US)

(73) Assignee: University of Washington, Seattle, WA (US)

( * ) Notice: Subject to any disclaimer, the term of this patent is extended or adjusted under 35 U.S.C. 154(b) by 677 days.

(21) Appl. No.: 11/222,022

(22) Filed: Sep. 8, 2005

(65) Prior Publication Data
US 2007/0236314 A1    Oct. 11, 2007

Related U.S. Application Data

(63) Continuation-in-part of application No. 11/070,385, filed on Mar. 1, 2005, now Pat. No. 7,280,016, which is a continuation-in-part of application No. 10/790,634, filed on Feb. 27, 2004, now Pat. No. 7,104,056.

(60) Provisional application No. 60/608,479, filed on Sep. 8, 2004, provisional application No. 60/548,968, filed on Mar. 1, 2004, provisional application No. 60/450,632, filed on Feb. 27, 2003, provisional application No. 60/450,633, filed on Feb. 27, 2003.

(51) Int. Cl.
*H01H 55/00* (2006.01)

(52) U.S. Cl. .................. 335/215; 310/26; 335/220

(58) Field of Classification Search ........ 335/220–232, 335/215; 310/26
See application file for complete search history.

(56) References Cited

U.S. PATENT DOCUMENTS 2,494,235 A    1/1950    Gierwiatowski ............. 250/40

(Continued)

FOREIGN PATENT DOCUMENTS

EP    0 997 953    5/2000

(Continued)

OTHER PUBLICATIONS

Johnson, Todd. "A Concept for an Inexpensive Low Speed Rotary Actuator Utilizing Shape Memory Alloy Filaments" FERMILAB-VLHCPUB-134, Nov. 1998. 11pp.

(Continued)

*Primary Examiner*—Elvin G Enad
*Assistant Examiner*—Bernard Rojas
(74) *Attorney, Agent, or Firm*—Ronald M. Anderson

(57) ABSTRACT

Linear actuators (also known as an inchworm actuator) including a magnetically actuatable shape memory alloy (SMA) are described. The linear actuators include a bar and an actuator assembly, configured to achieve a linear displacement of the actuator assembly relative to the bar. A hybrid magnetic trigger including an electromagnet and a permanent magnet is used to selectively attract the magnetically actuatable SMA toward the magnetic trigger. The motion of the magnetically actuatable SMA can be converted to a linear displacement. The magnetically actuatable SMA can be implemented using a SMA exhibiting both ferromagnetic and SMA properties, or by a ferromagnetic mass coupled with an SMA (i.e., a ferromagnetic SMA composite). Linear actuators including bars incorporating a ratchet mechanism, and featureless bars are described. A hydraulic system incorporating actuators including magnetically actuatable SMA membranes is also disclosed.

22 Claims, 12 Drawing Sheets

U.S. PATENT DOCUMENTS

| | | | | |
|---|---|---|---|---|
| 3,096,449 | A | 7/1963 | Stucki | 307/88.5 |
| 3,517,193 | A | 6/1970 | Mook, Jr. et al. | 250/83.1 |
| 3,942,759 | A | 3/1976 | Passera et al. | 251/129 |
| 4,945,727 | A | 8/1990 | Whitehead et al. | 60/527 |
| 5,071,064 | A | 12/1991 | AbuJudom et al. | 236/1 G |
| 5,080,205 | A | 1/1992 | Miller et al. | 188/299 |
| 5,475,353 | A | 12/1995 | Roshen et al. | 335/78 |
| 5,687,958 | A | 11/1997 | Renz et al. | 267/136 |
| 5,750,272 | A | 5/1998 | Jardine | 428/686 |
| 6,065,934 | A | 5/2000 | Jacot et al. | 416/155 |
| 6,326,707 | B1* | 12/2001 | Gummin et al. | 310/12 |
| 6,427,712 | B1 | 8/2002 | Ashurst | 60/527 |
| 6,457,654 | B1 | 10/2002 | Glezer et al. | 239/4 |
| 6,499,952 | B1 | 12/2002 | Jacot et al. | 60/527 |
| 6,530,564 | B1 | 3/2003 | Julien | 267/147 |
| 6,563,933 | B1 | 5/2003 | Niederdraenk | 381/417 |
| 6,609,698 | B1 | 8/2003 | Parsons et al. | 251/129.17 |
| 6,633,095 | B1 | 10/2003 | Swope et al. | 310/12 |
| 6,705,323 | B1 | 3/2004 | Nikolchev et al. | 128/830 |
| 6,796,124 | B2 | 9/2004 | Kutlucinar | 60/528 |
| 6,803,846 | B2* | 10/2004 | Ohta et al. | 335/215 |
| 6,832,477 | B2 | 12/2004 | Gummin et al. | 60/527 |
| 7,246,489 | B2* | 7/2007 | Du Plessis et al. | 60/528 |
| 2003/0202048 | A1 | 10/2003 | Silverbrook | 347/54 |
| 2003/0206490 | A1 | 11/2003 | Butler et al. | 367/163 |
| 2005/0016642 | A1* | 1/2005 | Oikawa et al. | 148/563 |
| 2005/0263359 | A1 | 12/2005 | Mankame et al. | 188/266.1 |
| 2006/0186706 | A1 | 8/2006 | Browne et al. | 296/203.01 |

FOREIGN PATENT DOCUMENTS

| | | |
|---|---|---|
| JP | 62 088890 | 4/1987 |
| JP | 62088890 A | 4/1987 |
| JP | 2002-129273 | 5/2002 |
| JP | 2002129273 A | 5/2002 |
| JP | 2002-285269 | 10/2002 |

OTHER PUBLICATIONS

Suorsa, I., Tellinen, J., Pagounis, E., Aaltio, I., and Ullakko, K. "Applications of Magnetic Shape Memory Actuators" Actuator 2002, Messe Bremen GMBH. Programme of Oral Sessions, Apr. 26, 2002.

Suorsa, I., Pagounis, E., and Ullakko, K. "Magnetic shape memory actuator performance" Journal of Magnetism and Magnetic Materials, vol. 272-276, pp. 2029-2030.

Tellinen, J., Suorsa, I., Jääskeläinen, A., Aaltio, I., and Ullakko, K. "Basic Properties of Magnetic Shape Memory Actuators" Actuator 2002, Bremen, Germany, Jun. 10-12, 2002.

Gorman, Jessica. "Fracture Protection: Nanotubes toughen up ceramics." *Science News Online*. Week of Jan. 4, 2003: vol. 163, No. 1, p. 3.

Lagoudas, Dimitris. "Dynamic Behavior and Shock Absorption Properties of Porous Shape Memory Alloys." *Storming Media*. A577304: Jul. 8, 2002. 3pp.

Lagoudas, Dimitris. "Pseudoelastic SMA Spring Elements for Passive Vibration Isolation: Part I—Modeling." *Storming Media*. A639824: Jun. 2004. 3 pp.

Lagoudas, Dimitris C., and Eric L. Vandygriff. "Processing and Characterization of NiTi Porous SMA by Elevated Sintering." *Center for Mechanics and Composites*. Aerospace Engineering Department, Texas A&M University, 22pp.

Liang, Yuanchang; Taya, M.; Kuga, Yasuo. "Design of membrane actuators based on ferromagnetic shape memory allow composite for the synthetic jet actuator." *Smart Structures and Materials 2004*. Proc. of SPIE vol. 5390 pp. 268-275.

Liang, Yuanchange; Taya, M.; Kuga, Yasuo. "Design of diaphram actuator based on ferromagnetic shape memory alloy composite." *Smart Structures and Materials 2003*. Proc. of SPIE vol. 5054 pp. 45-52.

Matsunaga, Yasuhiro et al. "Design of ferromagnetic shape memory alloy composites based on TiNi for robust and fast actuators." 2002. *Proc. SPIE on Smart Materials*. Mar. 17-21, 2002: 4699:172. 10pp.

Wada, Taishi and Taya, Minoru. "Spring-based actuators." *Smart Structures and Materials 2002*: Active Materials: Behavior and Mechanics, Christopher S. Lynch, Editor, Proceedings of SPIE vol. 4699 (2002). pp. 294-302.

Wu, Kevin E., and Breur, Kenneth S. "Dynamics of Synthetic Jet Actuator Arrays For Flow Control." *American Institute of Aeronautics and Astronautics*. © 2003. 8pp. Available at: <http://microfluids.engin.brown.edu/Breuer%20Group%20Papers.html>.

Ye, L.L., Liu, Z.G., Raviprasad, K., Quan, M.X., Umemoto, M., and Hu, Z.Q.. "Consolidation of MA amorphous NiTi powders by spark plasma sintering." *Materials Science and Engineering A241* (1998). pp. 290-293.

"Fine Particle Industry Review, 1998." *Business Communications Co.*, May 1999: 5pp.

Suorsa, Ilkka. "Performance and Modeling of Magnetic Shape Memory Actuators and Sensors." *Department of Electrical and Communications Engineering Laboratory of Electromechanics*. Helsinki University of Technology, 70 pp.

Ullakko, K. "Magnetically Controlled Shape Memory Alloys: A New Class of Actuator Materials" Journal of Materials Engineering and Performance, ASM International, Materials Park, OH. vol. 5, No. 3, Jun. 1, 1996; pp. 405-409.

Wada, Taishi and Taya, Minoru. "Spring-based actuators" Center for Intelligent Materials and System, University of Washington. Proceedings of SPIE—The International Society for Optical Engineering 2002, pp. 294-302.

Gorman, Jessica. "Fracture Protection: Nanotubes toughen up ceramics." *Science News Online*. Week of Jan. 4, 2003: vol. 163, No. 1, p. 3.

Heczko, C., Alexei Sozinov, and Kari Ullakko. "Giant Field-Induced Reversible Strain in Magnetic Shape Memory NiMnGa Alloy" IEEE Transactions on Magnetics, vol. 36, No. 5, Sep. 2000, pp. 3266-3268.

Kato, H., T. Wada, T. Tagawa, Y. Liang and M. Taya. "Development of Ferromagnetic Shape Memory Alloys Based on FePd alloy and Its Applications" Center for Intelligent Materials and Systems, University of Washington, Seattle, WA 98115, USA.

Lagoudas, Dimitris. "Dynamic Behavior and Shock Absorption Properties of Porous Shape Memory Alloys." *Storming Media*. A577304: Jul. 8, 2002. 3pp.

Lagoudas, Dimitris. "Pseudoelastic SMA Spring Elements for Passive Vibration Isolation: Part I—Modeling." *Storming Media*. A639824: Jun. 2004. 3pp.

Lagoudas, Dimitris C., and Eric L. Vandygriff. "Processing and Characterization of NiTi Porous SMA by Elevated Pressure Sintering." *Center for Mechanics and Composites*. Aerospace Engineering Department, Texas A&M University, 22pp.

Liang, Yuanchang; Taya, M.; Kuga, Yasuo. "Design of membrane actuators based on ferromagnetic shape memory allow composite for the synthetic jet actuator." *Smart Structures and Materials 2004*. Proc. of SPIE vol. 5390 pp. 268-275.

Liang, Yuanchange; Taya, M.; Kuga, Yasuo. "Design of diaphram actuator based on ferromagnetic shape memory alloy composite." *Smart Structures and Materials 2003*. Proc. of SPIE vol. 5054 pp. 45-52.

Matsunaga, Yasuhiro et al. "Design of ferromagnetic shape memory alloy composites based on TiNi for robust and fast actuators." 2002. Proc. SPIE on Smart Materials. Mar. 17-21, 2002: 4699:172. 10pp.

Song, Zhenlun et al. "Fabrication of closed cellular nickel alloy containing polymer by sintering method." Journal of Alloys and Compounds 355, pp. 166-170, 2003.

Suorsa Ilkka. *"Performance and Modeling of Magnetic Shape Memory Actuators and Sensors."* 3pp. <http://lib.tkk.fi/Diss/2005/isbn9512276453/>.

Suorsa Ilkka. "Performance and Modeling of Magnetic Shape Memory Actuators and Sensors." *Department of Electrical and Communications Engineering Laboratory of Electromechanics*. Helsinki University of Technology, 70pp.

Ullakko, K., J.K. Huang, C. Kantner, R.C. O'Handley, and V.V. Kokorin. "Large magnetic-field-induced strains in $Ni_2MnGa$ single crystals" Appl. Phys. Lett. 69 (13), Sep. 23, 1996, pp. 1966-1968.

Wada, Taishi, Ryan C.C. Lee, Simon H.H. Chen, Masahiro Kusaka, and Minoru Taya. "Design of spring actuators made of ferromagnetic shape memory alloy and composites" Smart Structures and Materials 2003: Industrial and Commercial Applications of Smart Structures Technologies, Eric H. Anderson, Editor, Proceedings of SPIE vol. 5054 (2003), pp. 125-134.

Wu, Kevin E., and Breur, Kenneth S. "Dynamics of Synthetic Jet Actuator Arrays For Flow Control." *American Institute of Aeronautics and Astronautics*. © 2003. 8pp. Available at: <http://microfluids.engin.brown.edu/Breuer%20Group%20Papers.html>.

Ye, L.L., Liu, Z.G., Raviprasad, K., Quan, M.X., Umemoto, M., and Hu, Z.Q.. "Consolidation of MA amorphous NiTi powders by spark plasma sintering." *Materials Science and Engineering A241* (1998). pp. 290-293.

"Fine Particle Industry Review, 1998." *Business Communications Co.*. May 1999: 5pp.

Gorman, Jessica. "Fracture Protection: Nanotubes toughen up ceramics." *Science News Online*. Week of Jan. 4, 2003: vol. 163, No. 1, p. 3.

Heczko, C., Alexei Sozinov, and Kari Ullakko. "Giant Field-Induced Reversible Strain in Magnetic Shape Memory NiMnGa Alloy" IEEE Transactions on Magnetics, vol. 36, No. 5, Sep. 2000, pp. 3266-3268.

Hodgson, Darel E. And Robert J. Biermann. "Shape Memory Alloys," ASM handbook, vol. 2, pp. 897-902, 1992.

Kato, H., T. Wada, T. Tagawa, Y. Liang and M. Taya. "Development of Ferromagnetic Shape Memory Alloys Based on FePd alloy and Its Applications" Center for Intelligent Materials and Systems, University of Washington, Seattle, WA 98115, USA.

Lagoudas, Dimitris. "Dynamic Behavior and Shock Absorption Properties of Porous Shape Memory Alloys." *Storming Media*. A577304: Jul. 8, 2002. 3pp.

Lagoudas, Dimitris. "Pseudoelastic SMA Spring Elements for Passive Vibration Isolation: Part I—Modeling." *Storming Media*. A639824: Jun. 2004. 3pp.

Lagoudas, Dimitris C., and Eric L. Vandygriff. "Processing and Characterization of NiTi Porous SMA by Elevated Pressure Sintering." *Center for Mechanics and Composites*. Aerospace Engineering Department, Texas A&M University, 22pp.

Liang, Yuanchang; Taya, M.; Kuga, Yasuo. "Design of membrane actuators based on ferromagnetic shape memory allow composite for the synthetic jet actuator." *Smart Structures and Materials 2004*. Proc. of SPIE vol. 5390 pp. 268-275.

Liang, Yuanchange; Taya, M.; Kuga, Yasuo. "Design of diaphram actuator based on ferromagnetic shape memory alloy composite." *Smart Structures and Materials 2003*. Proc. of SPIE vol. 5054 pp. 45-52.

Matsunaga, Yasuhiro et al. "Design of ferromagnetic shape memory alloy composites based on TiNi for robust and fast actuators." 2002. Proc. SPIE on Smart Materials. Mar. 17-21, 2002: 4699:172. 10pp.

Song, Zhenlun et al. "Fabrication of closed cellular nickel alloy containing polymer by sintering method." Journal of Alloys and Compounds 355, pp. 166-170, 2003.

Suorsa, Ilkka. *"Performance and Modeling of Magnetic Shape Memory Actuators and Sensors."* 3pp. <http://lib.tkk.fi/Diss/2005/isbn9512276453/>.

Suorsa Ilkka. "Performance and Modeling of Magnetic Shape Memory Actuators and Sensors." *Department of Electrical and Communications Engineering Laboratory of Electromechanics*. Helsinki University of Technology, 70pp.

Ullakko, K., J.K. Huang, C. Kantner, R.C. O'Handley, and V.V. Kokorin. "Large magnetic-field-induced strains in $Ni_2MnGa$ single crystals" Appl. Phys. Lett. 69 (13), Sep. 23, 1996, pp. 1966-1968.

Wada, Taishi, Ryan C.C. Lee, Simon H.H. Chen, Masahiro Kusaka, and Minoru Taya. "Design of spring actuators made of ferromagnetic shape memory alloy and composites" Smart Structures and Materials 2003: Industrial and Commercial Applications of Smart Structures Technologies, Eric H. Anderson, Editor, Proceedings of SPIE vol. 5054 (2003), pp. 125-134.

Wu, Kevin E., and Breur, Kenneth S. "Dynamics of Synthetic Jet Actuator Arrays For Flow Control." *American Institute of Aeronautics and Astronautics*. © 2003. 8pp. Available at: <http://microfluids.engin.brown.edu/Breuer%20Group%20Papers.html>.

Ye, L.L., Liu, Z.G., Raviprasad, K., Quan, M.X., Umemoto, M., and Hu, Z.Q.. "Consolidation of MA amorphous NiTi powders by spark plasma sintering." *Materials Science and Engineering A241* (1998). pp. 290-293.

"Fine Particle Industry Review, 1998." *Business Communications Co.*. May 1999: 5pp.

\* cited by examiner

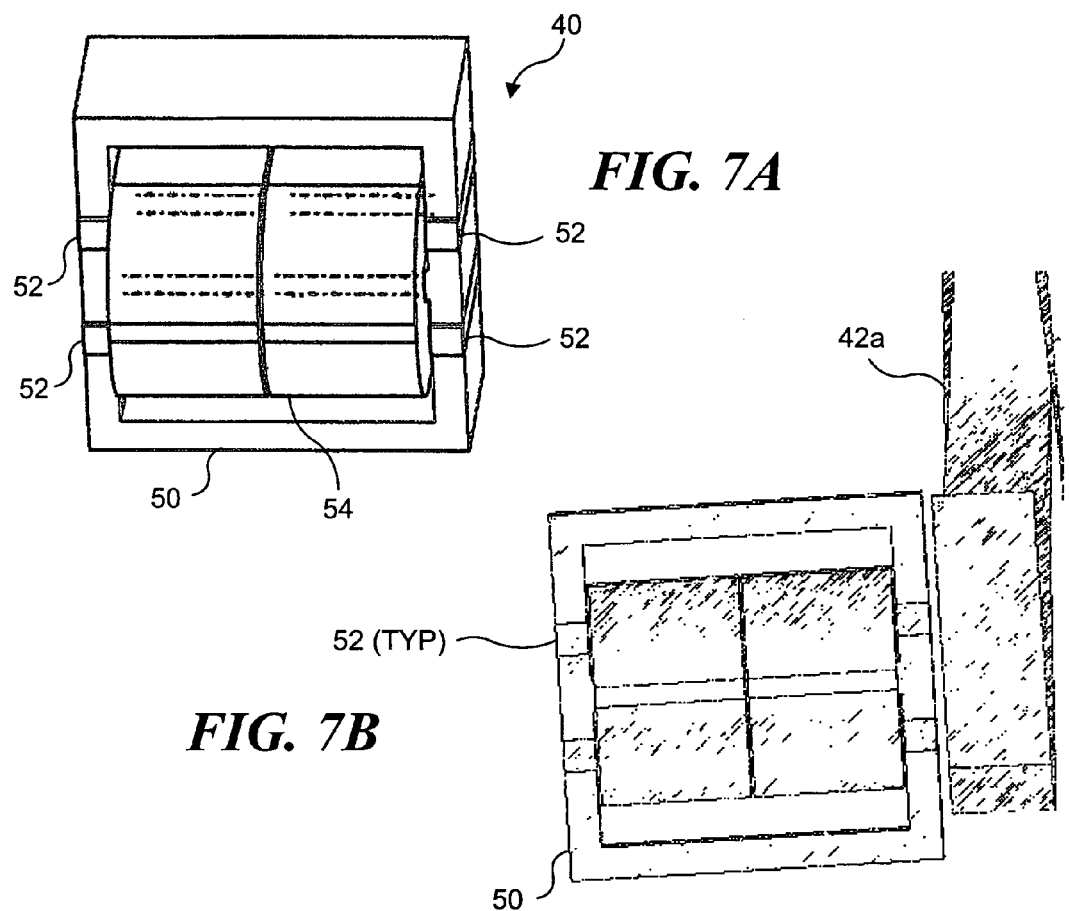
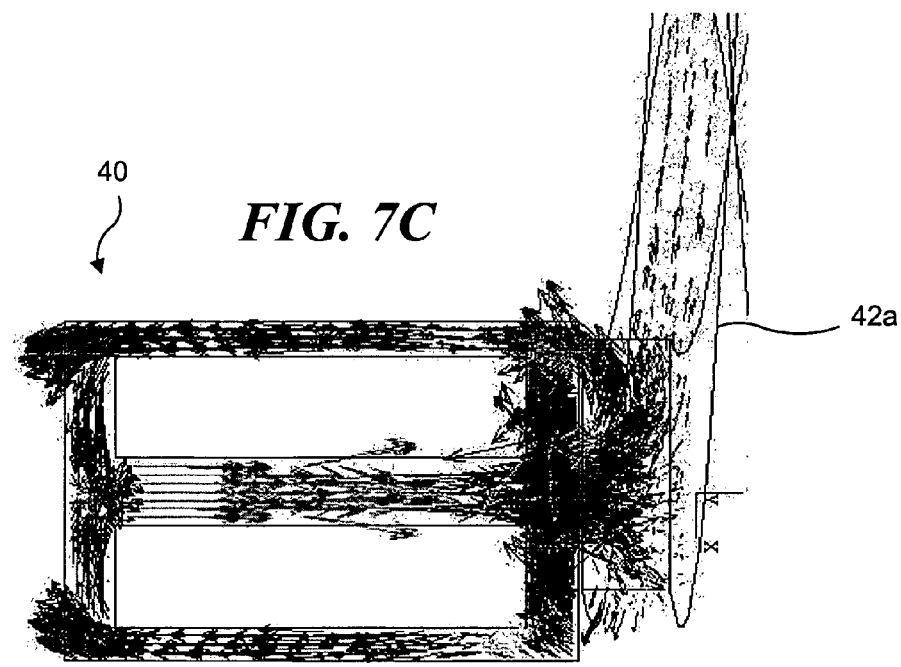

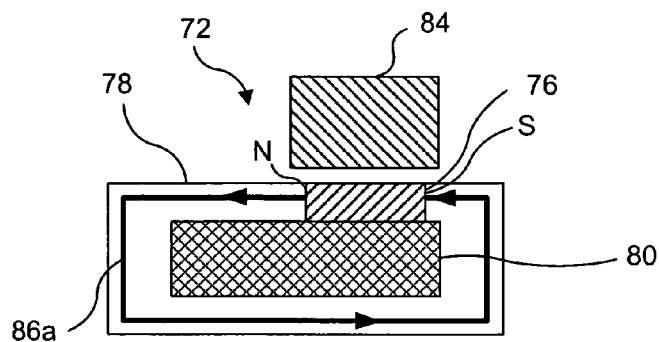
*FIG. 8A*
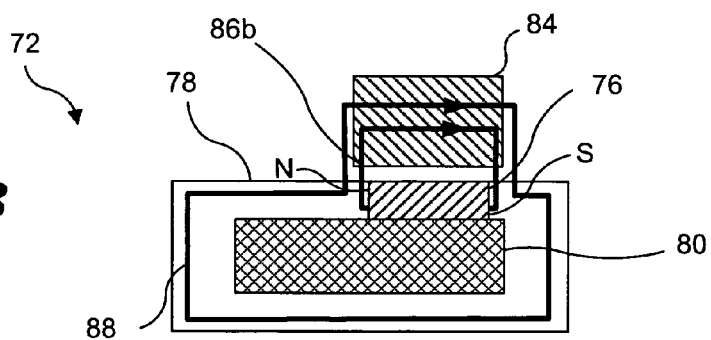
*FIG. 8B*
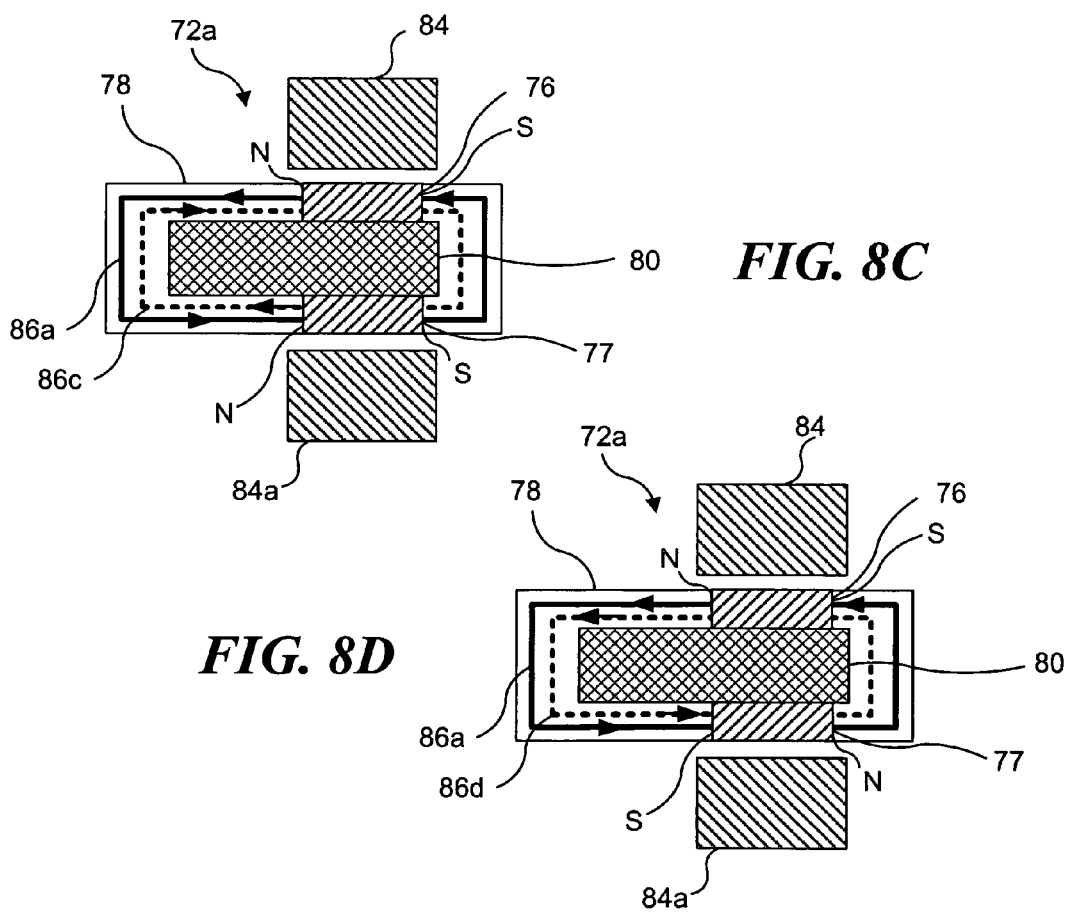
*FIG. 8C*
*FIG. 8D*

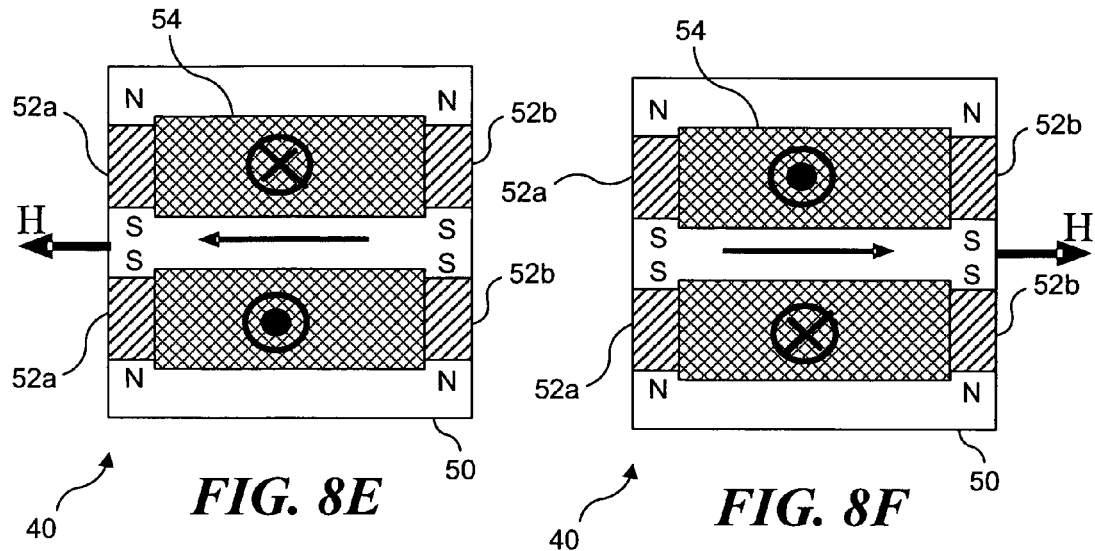
*FIG. 8E*  *FIG. 8F*
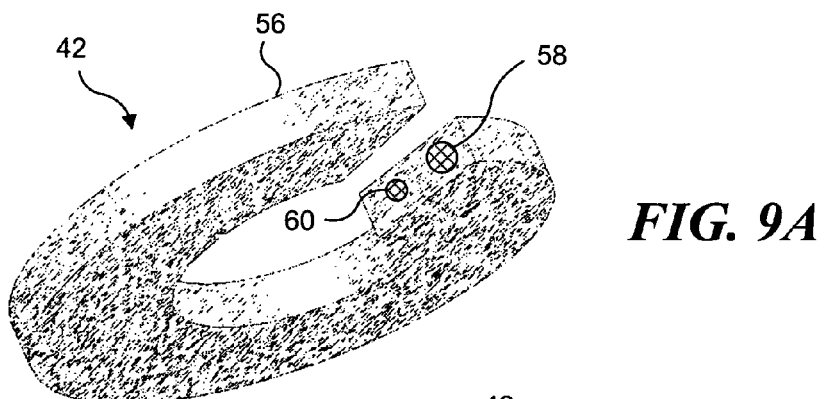
*FIG. 9A*
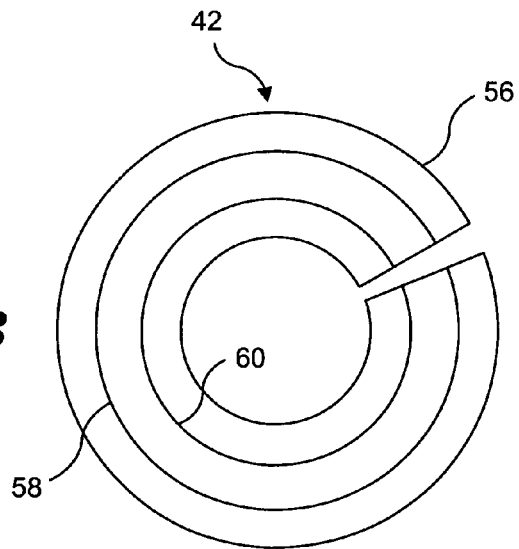
*FIG. 9B*

| | E1 | E2 | E3 | E4 | E5 | E6 | E7 | Stroke (mm) |
|---|---|---|---|---|---|---|---|---|
| 1. | 1A | off | off | off | off | off | off | 1.4 |
| 2. | 0.5 | 1 | off | off | off | off | off | 2.9 |
| 3. | 0.5 | 0.5 | 1 | off | off | off | off | 4.3 |
| 4. | 0.5 | 0.5 | 0.5 | 1 | off | off | off | 5.7 |
| 5. | 0.5 | 0.5 | 0.5 | 0.5 | 1 | off | off | 7.1 |
| 6. | 0.5 | 0.5 | 0.5 | 0.5 | 0.5 | 1 | off | 8.6 |
| 7. | 0.5 | 0.5 | 0.5 | 0.5 | 0.5 | 0.5 | 1 | 10 |
| 8. | 0.5 | 0.5 | 0.5 | 0.5 | 0.5 | 0.5 | 0.5 | |

Rows 1–7: Within 1 second

ACTUATORS BASED ON FERROMAGNETIC SHAPE MEMORY ALLOY COMPOSITES

GOVERNMENT RIGHTS

This invention was made with U.S. Government support under grants No. N-00014-02-1-0689 and N-00014-99-1-0520 awarded by Darpa/ONR. The U.S. Government has certain rights in the invention. sp

RELATED APPLICATIONS

This application is based on a prior provisional application, Ser. No. 60/608,479, filed on Sep. 8, 2004, the benefit of the filing date of which is hereby claimed under 35 U.S.C. §119 (e). This application is also a continuation-in-part of a patent application, Ser. No. 11/070,385, filed on Mar. 1, 2005 now U.S. Pat. No. 7,280,016, which itself is based on prior provisional application, Ser. No. 60/548,968, filed on Mar. 1, 2004, the benefits of the filing dates of which are hereby claimed under 35 U.S.C. §119(e) and 120. patent application Ser. No. 11/070,385 is further a continuation-in-part of a patent application Ser. No. 10/790,634, filed on Feb. 27, 2004 now U.S. Pat. No. 7,104,056, which itself is based on two prior provisional applications No. 60/450,632, filed on Feb. 27, 2003, and Ser. No. 60/450,633, filed on Feb. 27, 2003, the benefits of the filing dates of which are hereby claimed under 35 U.S.C. §119(e) and 120.

BACKGROUND

Actuators are relatively simple mechanical components that are often incorporated into more complex mechanical systems, including those found in automobiles, airplanes, manufacturing facilities, and processing facilities. A conventional solenoid is one example of an actuator that has found broad application across many types of industries and technologies.

Shape memory alloys (SMAs) are metals that exist in two distinct solid phases, referred to as Martensite and Austenite. Martensite is relatively soft and easily deformed, whereas Austenite is relatively stronger and less easily deformed. SMAs can be induced to change phase by changes in temperature and changes in mechanical stress. SMAs can generate relatively large forces (when resistance is encountered during their phase transformation), and can exhibit relatively large movements as they recover from large strains. SMAs have been used commercially in many types of actuators, where a temperature change is used to control the actuation cycle. One of the most widely recognizable applications has been the use of SMA based actuators in automatic sprinkler systems.

One disadvantage of SMA actuators triggered by changes in temperature is that, depending upon the application, a heating or cooling device may need to be incorporated into the actuator, increasing the size, expense, and complexity of the actuator. Further, the response of such an actuator depends on heat transfer, which can occur too slowly for certain applications. Material scientists have more recently recognized that the phase change between Martensite and Austenite can be induced by changes in an applied magnetic field in certain alloys, as well as by changes in temperature and stress loading. Because magnetic fields generated with electromagnets can be rapidly switched on and off, particularly as compared to the time required to induce a change in temperature to initiate an actuation, electromagnetically controlled SMA based actuators appear to offer promise in applications where rapidly responding actuation is required. Such alloys are referred to as ferromagnetic shape memory alloys (FSMAs).

One such type of FSMA is an alloy of iron and palladium (FePd). Unfortunately, the cost of palladium is so prohibitive that commercial utilization of FePd-based actuators is not now economically feasible. In an attempt to identify other materials that could be of use in FSMA actuators, composites of a ferromagnetic material and a SMA alloy that itself is not ferromagnetic have been suggested. Because of the widespread utility of actuators, it would be desirable to develop different embodiments of actuators incorporating FSMAs (or composite FSMAs) that will likely have commercial value.

SUMMARY

A first aspect of the concepts disclosed herein is a linear actuator (also known as an inchworm actuator), which includes an FSMA. FIG. 1 schematically illustrates a well-known prior art inchworm type actuator 10 incorporating a plurality of piezoelectric actuators, which actuate in sequence to move actuator 10 along a rod 11 in a direction as indicated by an arrow 18. First, a leading actuator 12 is actuated so that a clamp 13 disengages from rod 11. Next, extension actuator 16 is actuated, causing leading actuator 12 and clamp 13 to advance along rod 11. Leading actuator 12 is then actuated so that clamp 13 reengages rod 11. Then a trailing actuator 14 is actuated, causing a clamp 15 to disengage from rod 11. Extension actuator 16 is then actuated, causing trailing actuator 14 and clamp 15 to advance along rod 11. The cycle repeats to advance the inchworm actuator along the rod as desired.

In the context of the present disclosure of a novel development, an inchworm actuator incorporating FSMA-based actuators, rather than piezoelectric actuators, is described herein. Each actuator includes an FSMA-based member whose movement is controlled by a magnetic trigger. When the magnetic trigger is actuated, the FSMA-based member elastically deforms as the FSMA-based member is attracted to the magnetic trigger. Once the magnetic trigger is disengaged, the FSMA-based member returns to its original configuration. The movement of the FSMA-based member between its deformed configuration and its original configuration is used to move the inchworm actuator along a rod.

In one embodiment of an FSMA-based inchworm actuator described herein, the rod includes a plurality of teeth that enable the FSMA-based inchworm actuator to move in a single direction. Thus, the teeth on the rod and the FSMA-based inchworm actuator cooperate to form a ratchet mechanism (with the FSMA-based inchworm actuator acting as a pawl). In another embodiment, the rod includes no functional elements, and the FSMA-based inchworm actuator includes a plurality of clutches configured to control the movement of the FSMA-based inchworm actuator along the rod.

Each FSMA-based member can be formed from a homogeneous FSMA, such as FePd, or from an FSMA composite, in which a ferromagnetic material is coupled with an SMA, such that the SMA and the ferromagnetic material move together. Preferably, the magnetic trigger is configured to induce a stress-induced martensitic transformation in the SMA (or FSMA), to produce a greater force than would be achievable with non-SMA based materials. A particularly useful FSMA-based member can be formed by attaching ferromagnetic soft iron to a super elastic grade of NiTi shape memory alloy.

Preferably, a hybrid magnetic trigger is used, including at least one permanent magnet and at least one electromagnet. The electromagnet portion of the hybrid magnetic trigger enables a fast response to be achieved. Such hybrid magnetic triggers, which combine permanent magnets and electromagnets, enable greater deformations of the FSMA-based member to be achieved, as compared with the deformation achieved using only electromagnets. Permanent magnets alone (i.e., not in combination with electromagnets) are less desirable as magnetic triggers, because their magnetic field cannot be turned on and off as the magnetic field of electromagnets can be. If a permanent magnet alone is used as a magnetic trigger, then additional elements must be included to vary the magnetic flux between the permanent magnet and the FSMA-based member. For example, a prime mover that would move the permanent magnet relative to the FSMA base member could be employed, but that would significantly increase the size, cost, and complexity of the device as compared with devices implementing the more preferred hybrid magnetic trigger having both permanent and electromagnets.

The present disclosure further encompasses a method and apparatus for moving a fluid. In such a method, a membrane/diaphragm comprises at least one ferromagnetic material coupled with an SMA and an FSMA. The membrane/diaphragm is disposed in fluid communication with the fluid. The magnetic trigger actuates the membrane/diaphragm, such that the actuated membrane/diaphragm moves from a first position to a second position. Movement of the membrane/diaphragm causes a corresponding movement in the fluid. Preferably, the magnetic trigger employed is sufficiently powerful to induce a martensitic transformation in the SMA. Cyclical actuation of the membrane/diaphragm can be used to pump a fluid or generate a synthetic jet.

A particularly useful hydraulic apparatus including a NiTi membrane is also described. Significantly, the NiTi membrane has a higher stiffness value as compared to the rubber membranes conventionally employed in diaphragm pumps and diaphragm-based hydraulic systems. The increased stiffness of the NiTi membrane (as compared to that of a rubber membrane) enables the NiTi membrane apparatus to be capable of pumping relatively high viscosity liquids, which generally cannot be pumped using diaphragm-based pumps incorporating rubber membranes (due to the relatively low stiffness of the rubber membrane). A plurality of NiTi membrane actuators (or actuators incorporating other suitable FSMA membranes or FSMA composite membranes) can be placed in parallel to enhance the performance of the hydraulic apparatus.

This Summary has been provided to introduce a few concepts in a simplified form that are further described in detail below in the Description. However, this Summary is not intended to identify key or essential features of the claimed subject matter, nor is it intended to be used as an aid in determining the scope of the claimed subject matter.

DRAWINGS

Various aspects and attendant advantages of one or more exemplary embodiments and modifications thereto will become more readily appreciated as the same becomes better understood by reference to the following detailed description, when taken in conjunction with the accompanying drawings, wherein:

FIG. 1 schematically illustrates a prior art linear actuator commonly referred to as an inchworm actuator;

FIG. 2 schematically illustrates a first embodiment of a linear actuator including a magnetically actuatable SMA;

FIGS. 3A-3D are enlarged views of a portion of the linear actuator of FIG. 2, enabling details of the functioning of the actuator to be more readily discerned;

FIG. 4 schematically illustrates a second embodiment of a linear actuator including a magnetically actuatable SMA;

FIG. 5 schematically illustrates a preferred configuration of a plurality of magnetic triggers and a pair of magnetically actuatable SMA springs included in the linear actuator of FIG. 4;

FIG. 6 schematically illustrates internal details of the linear actuator of FIG. 4;

FIG. 7A schematically illustrates a hybrid magnetic trigger preferably incorporated into the linear actuators of FIGS. 1 and 4;

FIG. 7B schematically illustrates the hybrid magnetic trigger of FIG. 7A and a magnetically actuatable SMA;

FIG. 7C schematically illustrates the magnetic flux in the hybrid magnetic trigger of FIG. 7B when the hybrid magnetic trigger is energized;

FIG. 8A is a visual representation of magnetic flux lines present when a hybrid electromagnetic trigger is disposed adjacent to an FSMA composite spring and the hybrid magnetic trigger is not energized;

FIG. 8B is a visual representation of magnetic flux lines present when a hybrid electromagnetic trigger is disposed adjacent to an FSMA composite spring and the hybrid magnetic trigger is energized;

Figure 4:
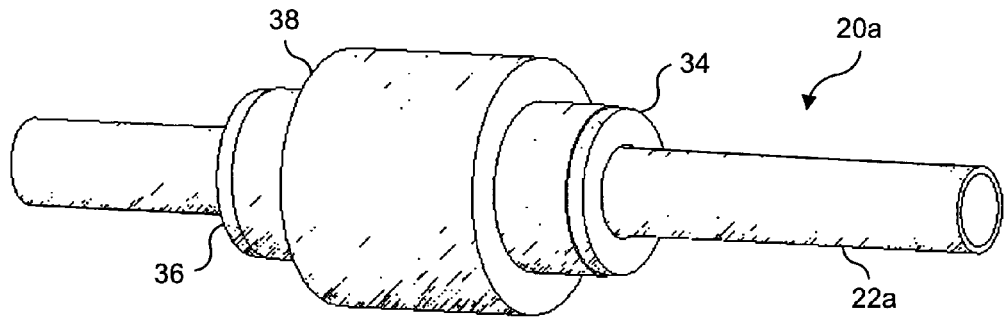
Figure 5:
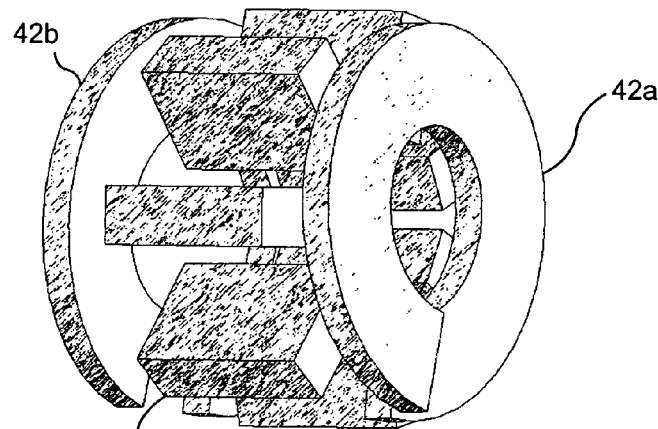
Figure 9C:
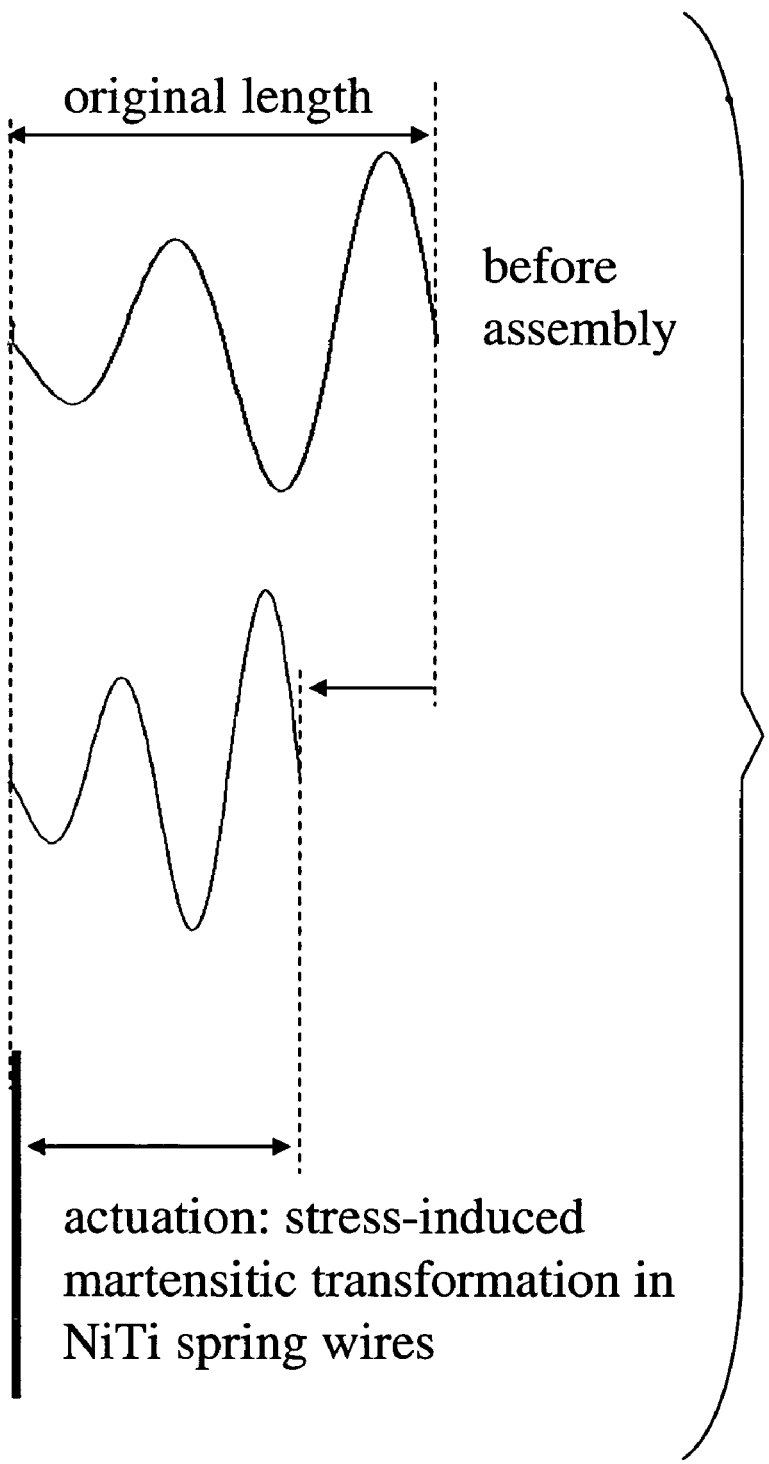
Figure 11:
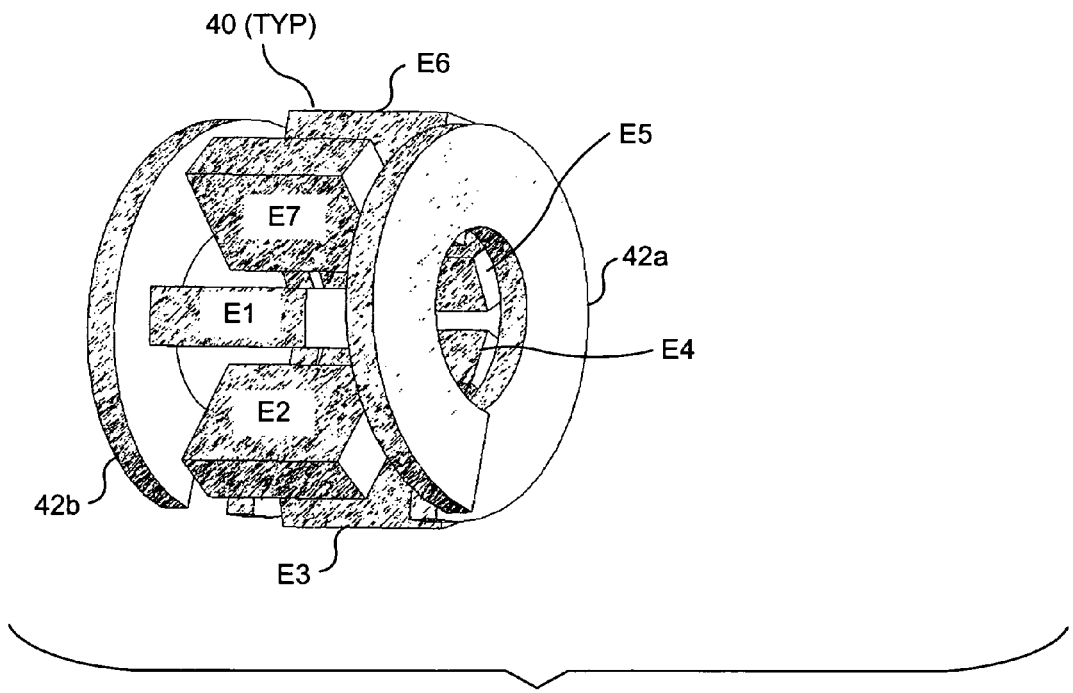
Figure 12A:
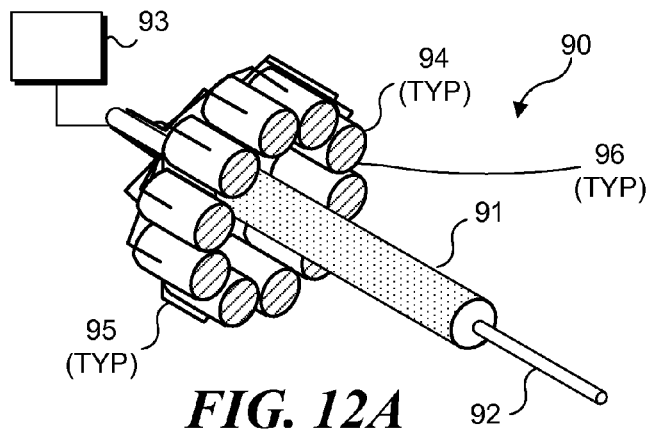
Figure 12B:
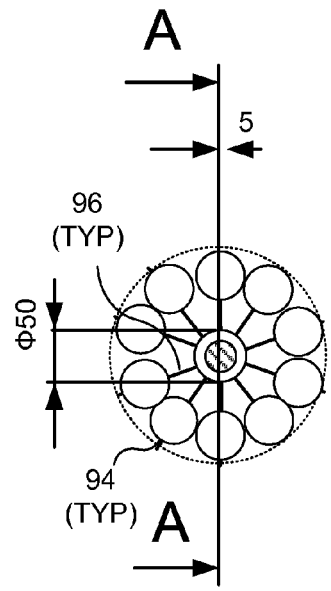
Figure 12C:
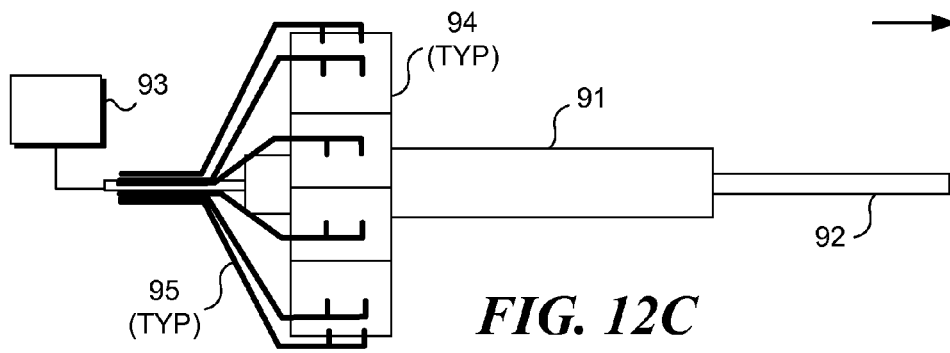
Figure 12D:
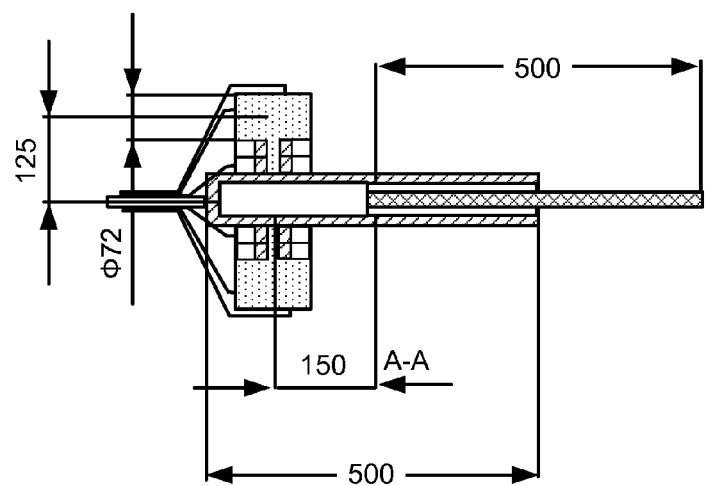
Figure 13:
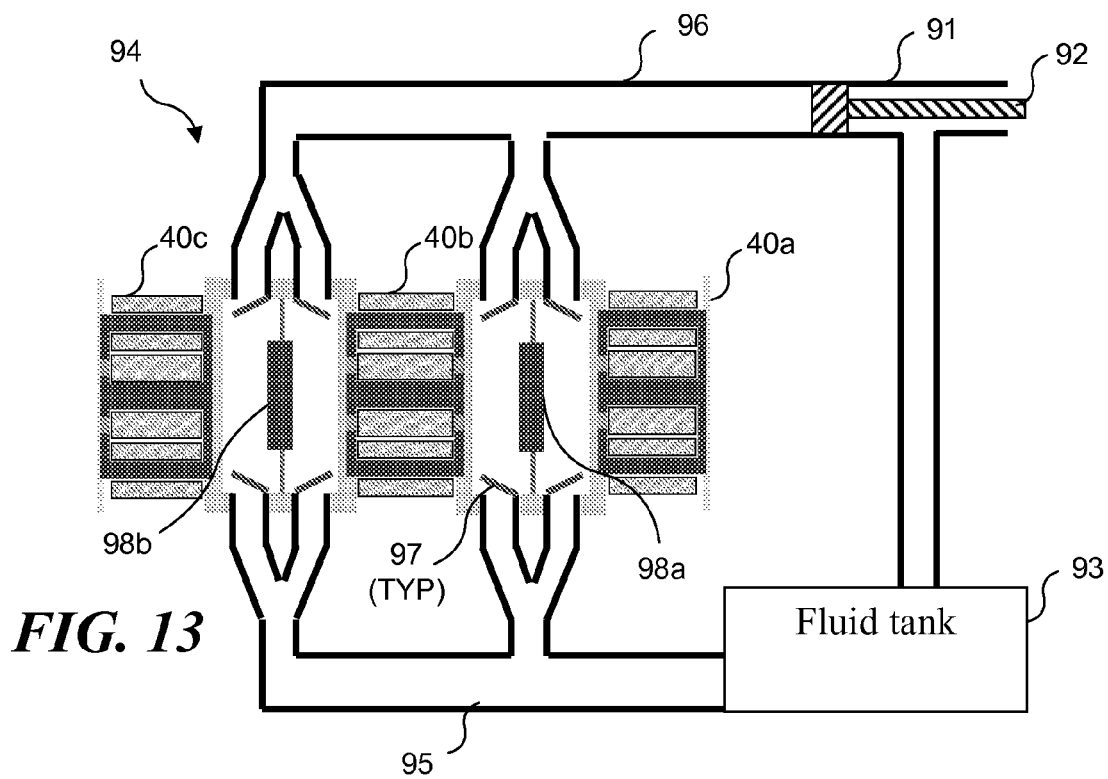
Figure 14A:
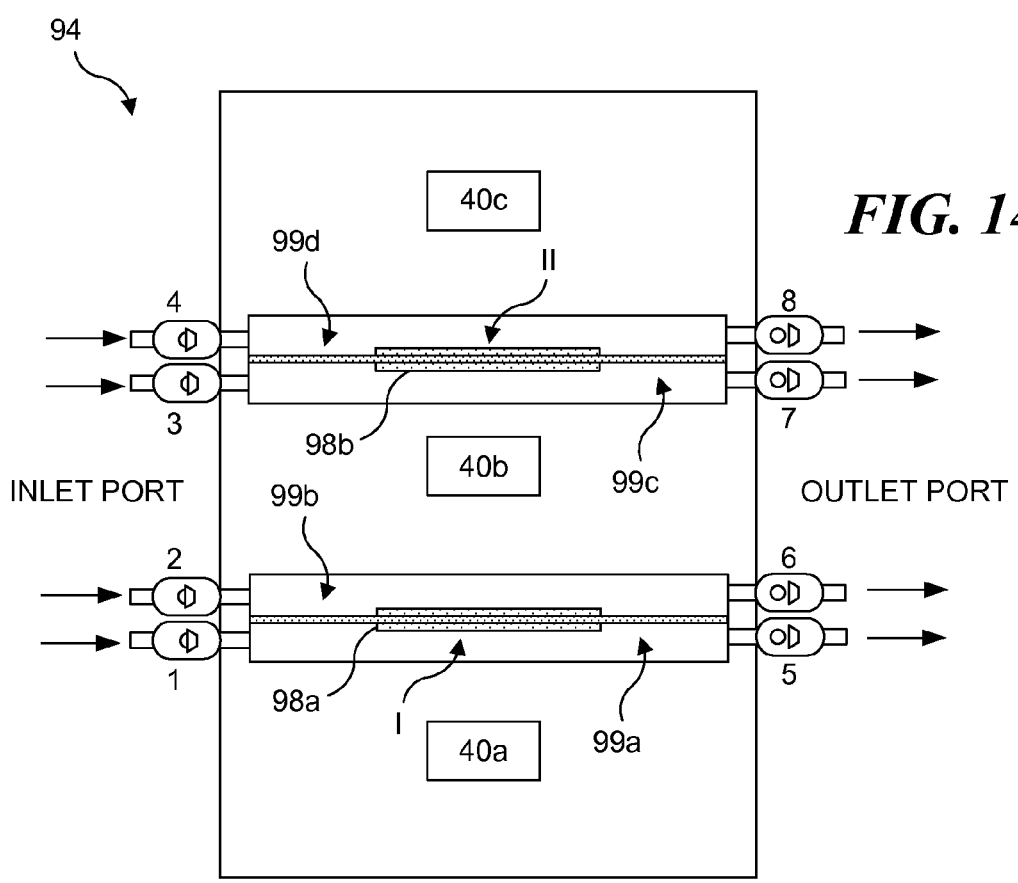
Figure 14B:
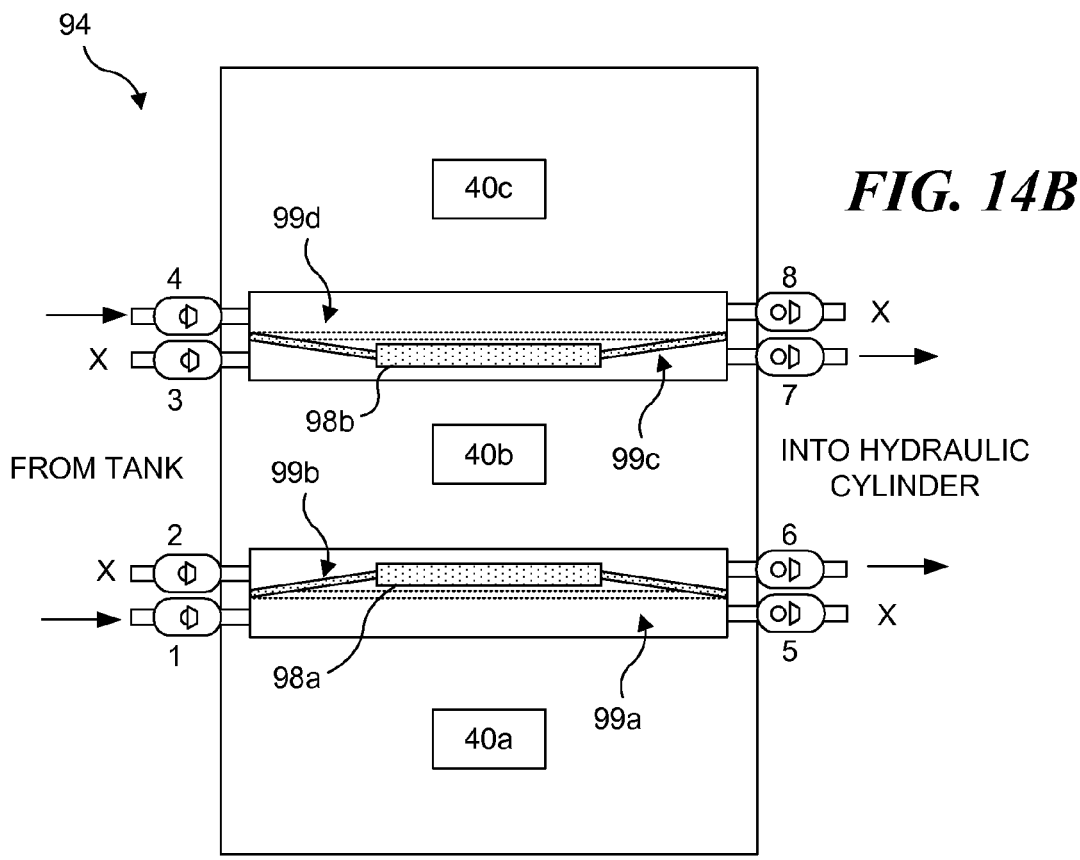
Figure 14C:
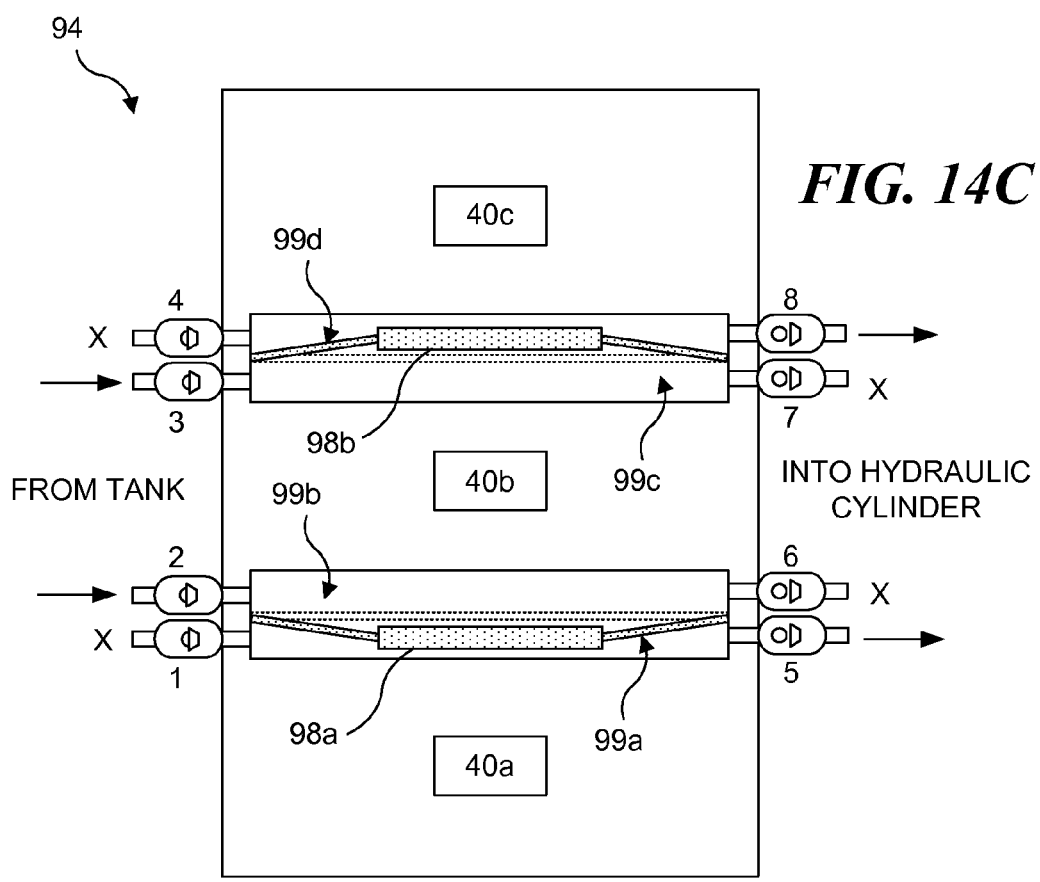

FIGS. 8C-8F schematically illustrate how a single hybrid magnetic trigger including a plurality of permanent magnets can be used to selectively actuate a pair of magnetically actuatable SMA springs;

FIGS. 9A and 9B are enlarged views of the magnetically actuatable SMA spring of FIG. 5, illustrating how in a preferred embodiment the magnetically actuatable SMA springs include a plurality of SMA elements;

FIG. 9C graphically illustrates how in a preferred embodiment the magnetically actuatable SMA springs of a linear actuator are preloaded before the actuator is assembled;

FIGS. 10A-10D are enlarged views of a portion of the linear actuator of FIG. 4, enabling details of the functioning of the actuator to be more readily observed;

FIG. 11 graphically illustrates how the plurality of magnetic triggers shown in FIG. 5 can be selectively actuated to control a stroke of the linear actuator of FIG. 4;

FIG. 12A is an isometric view of a hydraulic system including actuators incorporating magnetically actuatable SMA membranes;

FIG. 12B is a plan view of the hydraulic system of FIG. 12A;

FIG. 12C is a side elevational view of the hydraulic system of FIG. 12A;

FIG. 12D schematically illustrates exemplary dimensional details of the hydraulic system of FIG. 12A;

FIG. 13 schematically illustrates an actuator incorporated into the hydraulic system of FIG. 12A, enabling details of the actuators to be more readily observed;

FIGS. 14A-14C schematically illustrate an operational cycle of the actuators incorporated into the hydraulic system of FIG. 12A, enabling details of the functioning of the actuators to be more readily observed.

DESCRIPTION

Figures and Disclosed Embodiments are not Limiting

Exemplary embodiments are illustrated in referenced Figures of the drawings. It is intended that the embodiments and Figures disclosed herein are to be considered illustrative rather than restrictive.

The present disclosure refers to magnetically actuatable SMA members, FSMA members, and FSMA composite members. The term members should be understood to encompass structures including diaphragms, membranes, helical coil springs, plate springs, other spring structures, and other related structural elements. In general, the method and apparatus described herein involve the actuation of such structural elements by a magnetic trigger, where a structural element is attracted to the magnetic trigger. It is important to recognize that magnetically actuatable SMA members, FSMA members, and FSMA composite members all share the common characteristic of exhibiting SMA properties as well as the property of being ferromagnetic. This combination of properties can be achieved by using a material that inherently exhibits both ferromagnetic properties and SMA properties (such as FePd). It should also be recognized that this combination of properties can be achieved by combining a ferromagnetic material with an SMA material, to achieve the composite structure (such as can be achieved by coupling an iron component with a NiTi component). Where the disclosure refers to an FSMA member, it should be recognized that such a member can also be implemented using an FSMA composite member. Similarly, where the disclosure refers to a FSMA composite member, it should be recognized that such a member can also be implemented using an FSMA material that inherently exhibits both ferromagnetic properties and SMA properties. The term magnetically actuatable SMA member encompasses both FSMA materials that inherently exhibit both ferromagnetic properties and SMA properties, as well as FSMA composite structures.

Furthermore, the disclosure provided herein specifically describes particularly useful FSMAs. However, it should be recognized that the specific FSMAs described herein are intended to be exemplary, rather than limiting. It should also be recognized that the emphasis placed on the use of FSMA composites is in recognition that FSMA composites (such as an iron mass coupled with a NiTi alloy) are generally less expensive than true FSMAs (i.e., alloys that inherently exhibit both ferromagnetic and shape memory properties, such as FePd). It must be recognized, however, that true FSMAs can be used to achieve FSMA-based actuators that are functionally equivalent to those described herein. While such actuators would likely be significantly more expensive than actuators implemented using FSMA composites, if desired, such actuators could readily be implemented. Furthermore, it should be recognized that research into FSMAs continues, and lower-cost true FMSA components may become available as a consequence of further developments.

Many different combinations of ferromagnetic materials and non-ferromagnetic SMAs can be employed to achieve a magnetically actuatable SMA membrane. For example, the ferromagnetic material can be iron, or an iron, cobalt, and vanadium alloy (FeCoV). Also, the SMA can be an alloy of nickel and titanium (NiTi), or an alloy of nickel, titanium, and copper (NiTiCu).

Before discussing the actuators disclosed herein in greater detail, it may be helpful to review the mechanisms by which phase transformations are induced in FSMAs. The three mechanisms associated with FSMAs that can be used to cause the actuator materials to transform and provide the actuation movement are: (1) magnetic field-induced phase transformation; (2) Martensite variant rearrangement; and, (3) a hybrid mechanism. The hybrid mechanism involves sequential events, including applying a magnetic field gradient, such that magnetic force and stress inducing a phase transformation from stiff Austenite to soft Martensite, i.e., contributing to a greater portion of Martensite, can be employed to enhance a longer displacement or stroke. To enable a large stroke to be achieved, the hybrid mechanism is thus the more preferred of the three mechanisms.

In general, linear actuators disclosed herein include two major parts: (1) an actuator assembly including a magnetic based driving or triggering unit and a magnetically actuatable SMA spring; and, (2) a central bar or shaft. It should be recognized that the linear actuators encompassed by the present disclosure can be configured such that the actuator assembly remains fixed in position while the shaft moves relative to the actuator assembly, or the shaft can remain fixed in position while the actuator assembly moves relative to the shaft. Furthermore, as will become clear in the discussion below, the relative motion can occur when a distance separating the magnetically actuatable SMA spring and the magnetic triggering unit decreases, when the distance separating the magnetically actuatable SMA spring and a magnetic triggering unit increases, or both. Those of ordinary skill in the art will readily recognize that even where only one configuration is specifically disclosed, the other configurations are also encompassed by the disclosure.

By using an SMA to implement an actuatable member, the actuator is able to produce a greater force than could readily be achieved using non-SMA actuatable members. Preferably, the magnetic trigger can supply a magnetic field gradient sufficient to induce stress-induced martensitic phase transformation in the SMA actuatable member, thus enhancing the displacement of the actuatable member during actuation. Magnetic triggers can be implemented with either a permanent magnet and/or an electromagnet. If a magnetic trigger is implemented with a permanent magnet, actuation can be achieved by moving the magnetic trigger relative to magnetically actuatable SMA member, until the magnetic gradient provided by the permanent magnet causes the magnetically actuatable member to deform. While technically possible to implement, such a configuration requires a prime mover to move the magnetic trigger, which will increase the cost, size, weight, and complexity of a magnetically actuatable SMA member based actuator. If the magnetic trigger is implemented with an electromagnet, a prime mover is not required to actuate the magnetically actuatable SMA member. Use of an electromagnet to implement the magnetic trigger enables simple, compact, and readily controllable magnetically actuatable SMA member actuators to be achieved.

A further improvement can be achieved with the use of a hybrid magnetic trigger. As noted above, electromagnets offer significant advantages over the use of permanent magnets. A hybrid magnetic trigger includes both an electromagnet and a permanent magnet. When properly designed, the magnetic gradient provided by the electromagnet portion of the hybrid magnetic trigger significantly enhances the magnetic gradient provided by the permanent magnet, and a stronger magnetic gradient can be achieved than would be possible using only an electromagnet of the same size. In general, the magnetic gradient provided by the permanent magnet is not sufficient to induce motion between the magnetic trigger and the magnetically actuatable SMA member until additional magnetic flux is provided by energizing the electromagnet. Further, the magnetic gradient provided by the permanent magnet is not sufficient to prevent the magnetically actuatable SMA member from returning to its original position once the electromagnet is turned off.

A First Exemplary Linear Actuator Incorporating a Magnetically Actuatable SMA

Figure 1:
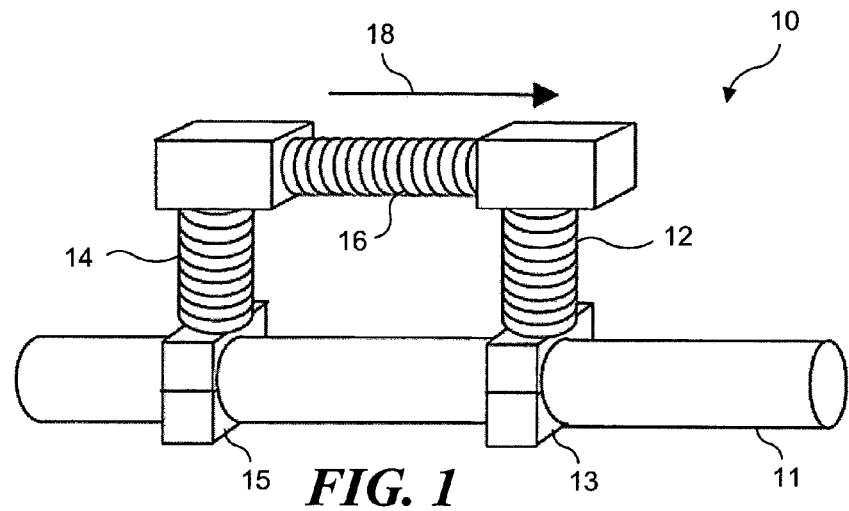
Figure 2:
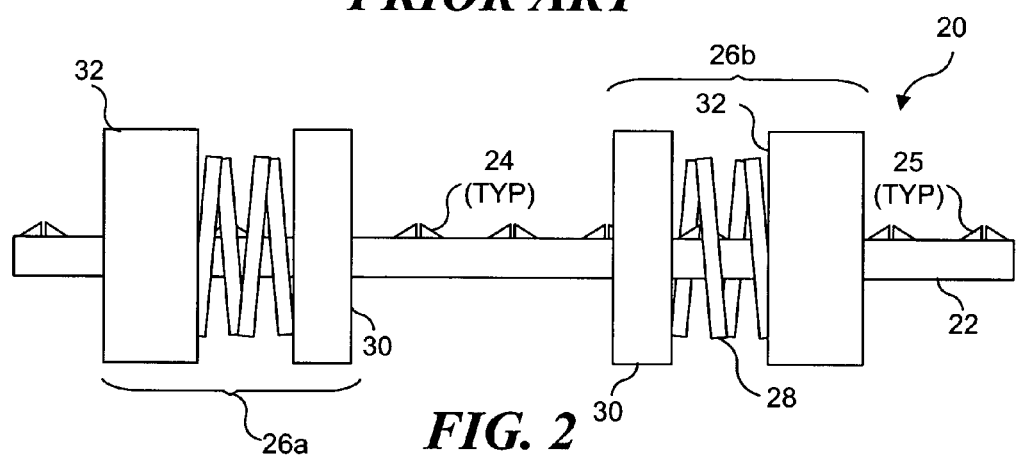

FIG. 2 schematically illustrates a first exemplary embodiment of a linear actuator 20 including a magnetically actuatable SMA. Linear actuator 20 includes a central bar 22 and a pair of actuators 26a and 26b. Each actuator includes a magnetically actuatable SMA spring 28, a fixed end 32, and a free end 30. A magnetic trigger (preferably an electromagnet or a hybrid magnetic trigger, as noted above) is included in fixed end 32. Note that central bar 22 includes a plurality of ratchet teeth. Significantly, the ratchet teeth are configured into two groups of selectively actuatable teeth. All teeth having the configuration of a tooth 24 are members of a first group of ratchet teeth, and all teeth having the configuration of a tooth 25 are members of a second group of ratchet teeth. As will be described in greater detail below, each group of the teeth are configured to retract into central bar 22, depending on which actuator is to be energized. The specific mechanism employed to selectively retract a group of teeth is not critical. Preferably, the mechanism responsible for retracting a group of teeth is logically coupled to the corresponding actuator, such that when the actuator is to be energized, the corresponding group of teeth automatically retracts. A first actuator facilitates a linear motion in a first direction while acting on one of the teeth in a first group, while the other actuator facilitates a linear motion in an opposite direction, while acting on one of the teeth in the other group. If desired, both actuators can be enclosed in a common housing (not separately shown), to achieve a single actuator assembly. Exemplary dimensions for linear actuator 20a are also provided, although it should be understood that such dimensions are not intended to be limiting.

FIGS. 3A-3D are enlarged views of a portion of linear actuator 20 of FIG. 2, enabling details of the functioning of the actuator to be more readily observed. In connection with these Figures, the actuation of actuator 26a, and the relative motion between that actuator and bar 22, are described. The functioning of the additional actuator is identical, except that a direction of the relative motion between the additional actuator and bar 22 is reversed (and the other group of ratchet teeth will be retracted, as discussed below).

Figure 3A:
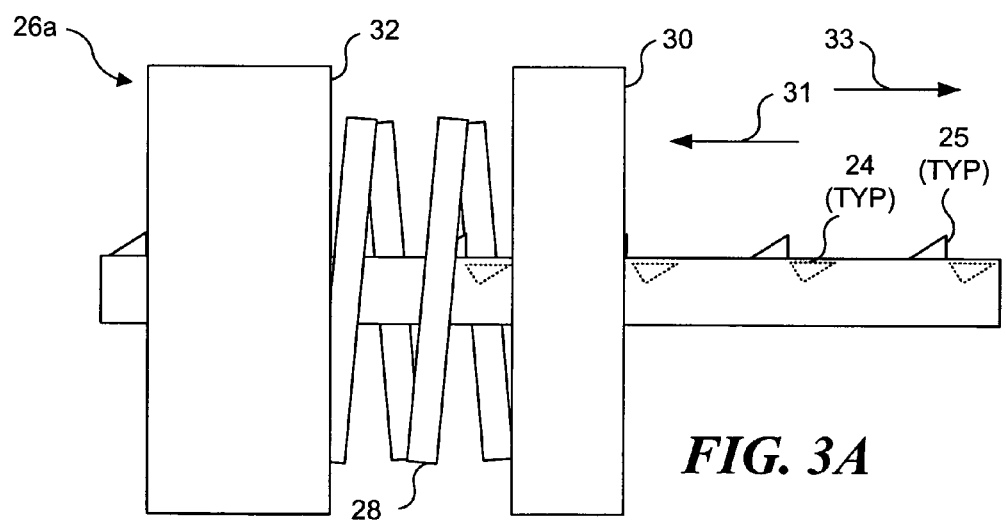

Referring to FIG. 3A, a hybrid magnetic trigger incorporated into fixed end 32 is not energized, and magnetically actuatable SMA spring 28 is in a relaxed or partially relaxed configuration. The group of ratchet teeth corresponding to tooth 24 are retracted into bar 22 to facilitate the linear motion described in FIGS. 3B-3D. Note that the group of ratchet teeth corresponding to tooth 25 remain un-retracted. Thus, the group of ratchet teeth corresponding to tooth 25 will facilitate motion of bar 22 in a direction indicated by an arrow 31 by interacting with actuator 26a (similarly, the group of ratchet teeth corresponding to tooth 24 will facilitate motion of bar 22 in a direction indicated by an arrow 33 by interacting with actuator 26b).

Figure 3B:
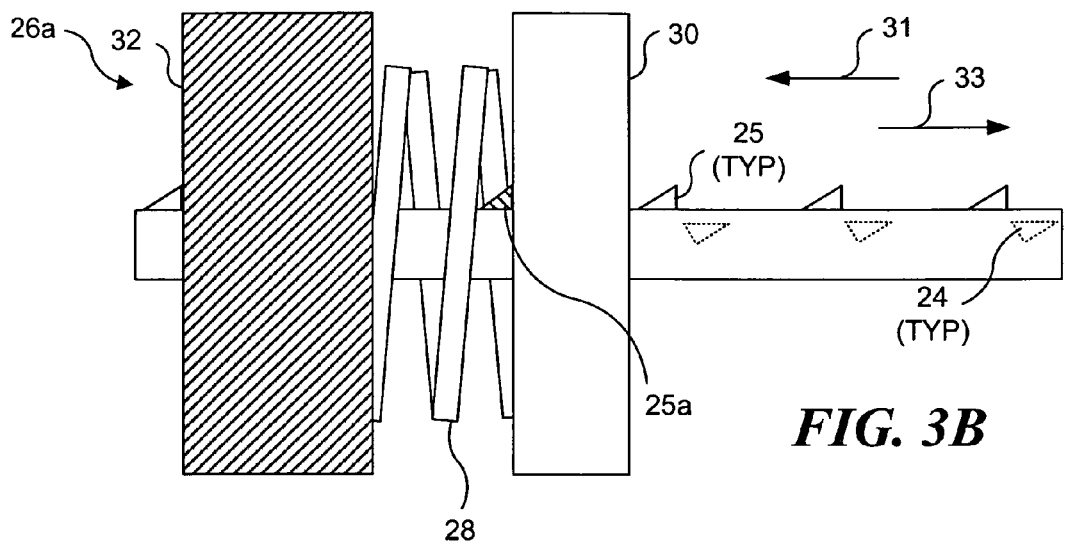

Referring to FIG. 3B, the hybrid magnetic trigger incorporated into fixed end 32 of actuator 26a is energized, and magnetically actuatable SMA spring 28 is attracted to fixed end 32 (i.e., the spring begins to compress). Because free end 30 is coupled to spring 28, free end 30 begins to move in the direction indicated by arrow 31, until free end 30 encounters a tooth 25a, which prevents free end 30 from moving further along bar 22 in the direction indicated by arrow 31

Figure 3C:
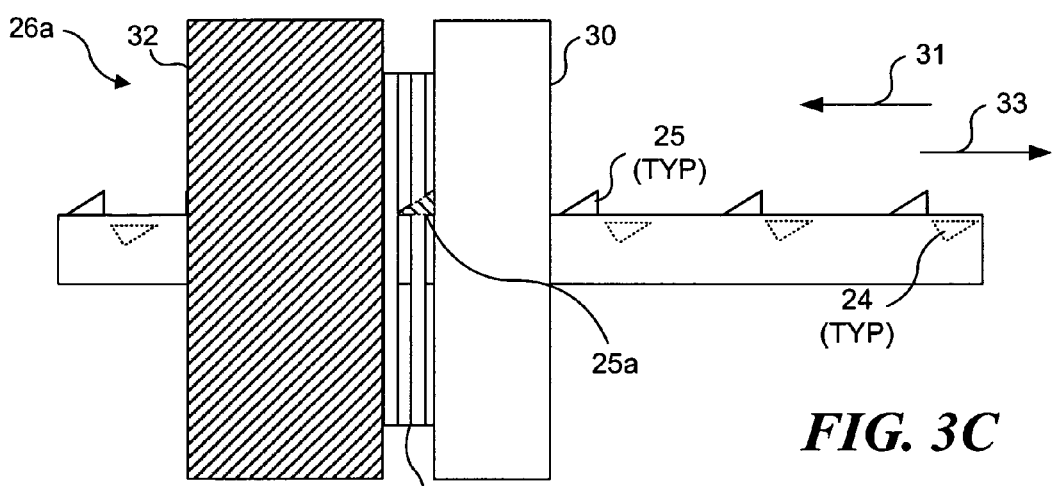

Referring to FIG. 3C, the hybrid magnetic trigger incorporated into fixed end 32 remains energized, and magnetically actuatable SMA spring 28 compresses further (eventually reaching a maximum compressed state if the hybrid magnetic trigger remains energized). Because free end 30 is coupled to spring 28 and is prevented from moving further along bar 22 in the direction of arrow 31 by tooth 25a, free end 30 acts on tooth 25a to cause bar 22 to move linearly in the direction indicated by arrow 31. Note also that fixed end 32 is configured to enable the group of ratchet teeth corresponding to tooth 25 to "slip" past fixed end 32, without interfering with the above noted linear motion of bar 22. This can be achieved by configuring the ratchet teeth to retract into the bar when a force is applied to the sloping portion of the ratchet teeth, or by including a slot or passage in free end 32 that is sized to permit all of the teeth to pass freely through the fixed end without engaging the fixed end.

Figure 3D:
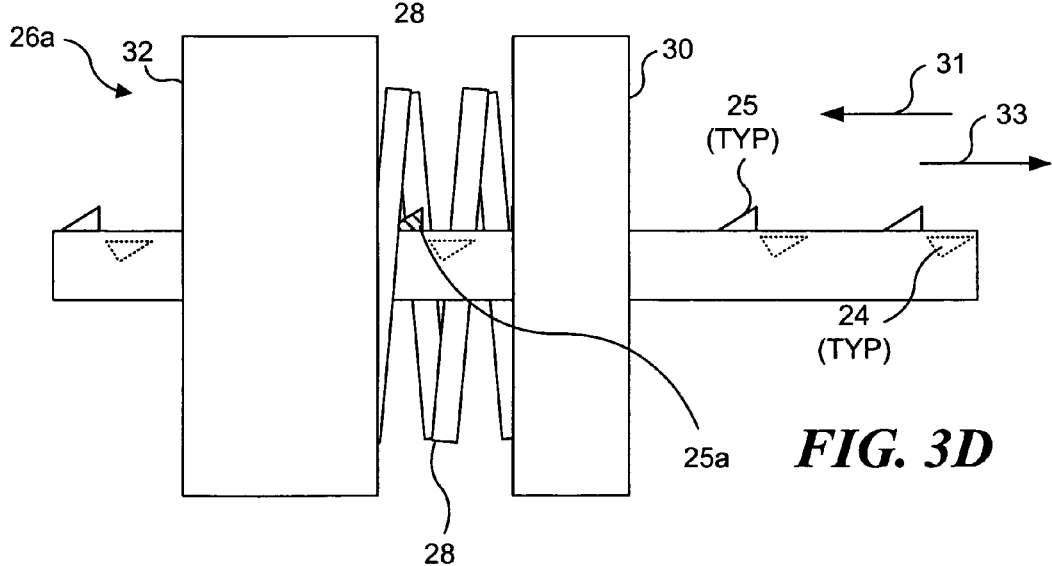

Referring to FIG. 3D, the hybrid magnetic trigger incorporated into fixed end 32 has been de-energized, and magnetically actuatable SMA spring 28 begins to return to its original shape, causing free end 30 to move in a direction indicated by arrow 33. Spring 28 will decompress until free end 30 is in its original position (relative to fixed end 32). At this point, the cycle can be repeated to linearly displace bar 22 an additional distance in the direction indicated by arrow 31. If bar 22 is to be linearly displaced in the direction indicated by arrow 33, the group of ratchet teeth corresponding to tooth 24 will need to be returned to their original upright position (as indicated in FIG. 2). Then, the group of ratchet teeth corresponding to tooth 25 will need to be retracted into bar 22, so that actuator 26b can be energized to linearly displace bar 22 in the direction indicated by arrow 33.

Those of ordinary skill in the art will recognize that the configuration and orientation of the teeth will have significant impact on the stroke and movement of linear actuator. Linear actuator 20 provides a simple, robust, and compact linear actuator having a relatively large force and an unlimited stroke in two directions. Such a linear actuator is expected to be useful for compact axial actuators mounted in airborne and ground vehicles. A finite element analysis model (FEM) of linear actuator 20 indicates that linear actuator 20 can be implemented to achieve the following performance parameters: a stroke for each step of about 15 to about 25 mm, a total stroke of about 25 mm, a lifting force of about 50 N (about 11 pounds), a power draw of about 5 amps at 20 to 30 V, and a weight of about 2.6 kg. Note that the stroke of the actuator can be increased by repeated actuation of the actuators, thus the travel is limited only by the length of the bar or shaft.

A Second Exemplary Linear Actuator Incorporating a Magnetically Actuatable SMA

FIG. 4 schematically illustrates a second embodiment of a linear actuator including a magnetically actuatable SMA. A linear actuator 20a includes a central bar 22a, and actuator assembly 38, a first overrun clutch assembly 34, and a second overrun clutch assembly 36. Note that bar 22a does not incorporate any teeth to selectively control a relative linear motion between the bar and the actuator assembly; instead, the clutch assemblies incorporated into the actuator assembly are responsible for controlling the relatively linear motion.

FIG. 5 provides details about the functional elements of actuator assembly 38, which includes a plurality of magnetic triggers 40 (preferably hybrid magnetic triggers) and a pair of magnetically actuatable SMA springs 42a and 42b.

Figure 6:
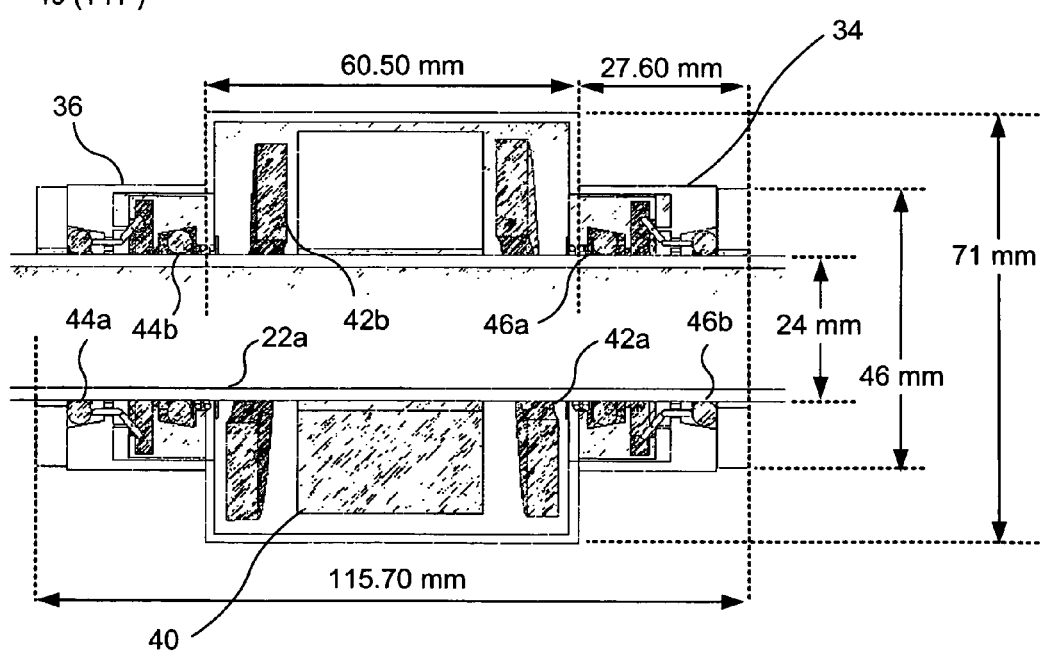

FIG. 6 schematically illustrates internal details of linear actuator 20a, indicating that each overrun clutch assembly includes a plurality of individual clutches. Specifically, overrun clutch assembly 34 includes a clutch 46a and a clutch 46b, while overrun clutch assembly 36 includes a clutch 44a and a clutch 44b.

FIG. 7A schematically illustrates an exemplary configuration for each hybrid magnetic trigger 40 incorporated into linear actuator 20a. It should also be recognized that such a hybrid magnetic trigger can also be beneficially incorporated into linear actuator 20 of FIG. 2. In a hybrid magnetic trigger, a soft iron yoke is used to magnetically couple one or more permanent magnets to an electromagnet. The electromagnet portion of the hybrid magnetic trigger enables fast response to be achieved. Such hybrid magnetic triggers, which combine permanent magnets and electromagnets, enable larger deformations of magnetically actuatable SMA components to be achieved, as compared with the use of electromagnets alone.

Referring to FIG. 7A, exemplary hybrid magnetic trigger 40 includes an electromagnet 54 and permanents magnet 52. It should be noted that FIG. 7A is not intended to show each component to scale, but is instead intended to illustrate the structural relationship of the components included in an exemplary hybrid magnetic trigger. An energy source and conductors coupling the electromagnet to the energy source have been omitted to simplify the Figure, although those of ordinary skill will recognize that electromagnet 54 must be energized with an electrical current provided by a power source, such as a battery, or a conventional power supply energized using an alternating current line connection. A yoke 50 (whose specific shape is not critical, so long as the yoke facilitates directing magnetic flux, generally as described below) is formed of a magnetically permeable material, such as iron. It should be understood that yoke 50 can be implemented in various shapes and sizes as desired, and any specific yoke described herein is intended to be exemplary, rather than limiting on the scope of the disclosure. As shown, hybrid magnetic trigger 40 includes a permanent magnet in contact with electromagnet 54, although it should be understood that actual physical contact between the permanent magnet and the electromagnet is not required.

To achieve a yoke of a desired shape, iron powder can be cast, sintered, or cold pressed into the desired shape. Mixtures of powdered ferromagnetic metals and polymers can be combined and then sintered or cold pressed into the desired shape. Incorporating polymers into a yoke will advantageously reduce the weight of the yoke. It should be recognized that before the mass or weight of the yoke can be minimized, the required paths of the magnetic flux must be identified. Those of ordinary skill in the art will recognize that several different techniques can be used to identify magnetic flux paths. For example, finite element analysis can be used to determine the magnetic flux paths. The mass of the yoke can be reduced by using a magnetically permeable material such as iron only in portions of the yoke required to facilitate movement of the magnetic flux.

Empirical testing of hybrid magnetic triggers has indicated that eddy currents induced in the yoke of the hybrid magnet system may cause energy loss and reduce the actuator efficiency. Minimizing eddy currents will likely enable more efficient hybrid magnetic triggers to be built. Such empirical studies have indicated that reducing the turns of the coil in the hybrid magnetic trigger may lead to an increase in efficiency, because the magnetic field produced by a coil slightly decreases when the signal frequency exceeds about 80 Hz. To increase the efficiency of the hybrid magnetic trigger at higher frequencies, eddy currents can be reduced by using a laminated yoke in a plane perpendicular to the direction of the eddy currents, and small-distributed coils.

It should be understood that the present disclosure is not limited to the specific hybrid magnetic trigger embodiments discussed above in detail. Those of ordinary skill in the art will appreciate that many other hybrid magnet trigger designs are possible. An important element in hybrid magnetic trigger design is an understanding of the flow of magnetic flux in the hybrid magnetic trigger, both while the electromagnet is energized, and while it is not. When the direction of the magnetic flux provided by a permanent magnet opposes the direction of magnetic flux provided by the electromagnet, an enhanced magnetic flux will be emitted outwardly and away from the permanent magnet. Based on that understanding, the polar orientation of permanent magnets can be selected such that the hybrid magnetic trigger is capable of simultaneously or alternately actuating SMA members disposed adjacent to the permanent magnets. Different hybrid magnetic trigger designs can be employed, with the goal of the hybrid magnetic triggers being capable of exerting larger forces on the SMA members, while using energy as efficiently as possible.

Referring to FIG. 7B, a preferred orientation of the hybrid magnetic trigger of FIG. 7A and a magnetically actuatable SMA is indicated. Note that magnetically actuatable SMA spring 42a is disposed adjacent to permanent magnets 52, such that a gap exists between magnetically actuatable SMA spring 42a and the permanent magnets. This gap should be large enough such that when the electromagnet is not energized, the magnetic flux of the permanent magnets is insufficient to cause spring 42a to move towards the hybrid magnetic trigger. Furthermore, the gap should be small enough such that when the electromagnet is energized, the combined magnetic flux of the permanent magnets and the electromagnets is sufficient to cause spring 42a to move towards the hybrid magnetic trigger.

FIG. 7C schematically illustrates the magnetic flux in the hybrid magnetic trigger of FIG. 7B when the hybrid magnetic trigger is energized, indicating that magnetic flux from the hybrid magnetic trigger is "punched out" towards spring 42a, to cause spring 42a to move towards the hybrid magnetic trigger.

Additional details of how hybrid magnetic triggers couple flux to magnetically actuatable SMA members disposed adjacent to the hybrid magnetic trigger are described in connection with FIGS. 8A-8E.

FIG. 8A schematically illustrates the magnetic flux exhibited by a hybrid magnetic trigger 72 in the non-energized state (i.e., when the electromagnet is off), while FIG. 8B schematically illustrates the magnetic flux exhibited by a hybrid magnetic trigger 72 in the energized state (i.e., when the electromagnet is on). In a hybrid magnet trigger, the polarity of the permanent magnet is oriented such that the magnetic flux lines generated will be conveyed through the yoke material in the opposite direction of the flux lines generated by the electromagnet (this effect can be controlled either by the physical position of the permanent magnet or by the direction of the current used to energize the electromagnet). When the electromagnet is de-energized, the magnetic flux lines from the permanent magnet will flow unobstructed throughout the yoke, as shown in FIG. 8A.

Referring to FIG. 8A, a flux line 86a is provided by a permanent magnet 76 and establishes a closed loop within a yoke 78. The direction of the flux lines is a function of the polar orientation of the permanent magnet. By convention, magnetic flux is considered to flow externally from a magnet's north pole to its south pole. If, for example, the polar orientations of permanent magnet 76 is reversed, the direction of the magnetic flux would be reversed as well. When electromagnet 80 is not energized, the magnetic flux provided by permanent magnet 76 is insufficient to couple the required actuating magnetic force to a ferromagnetic mass 84.

In FIG. 8B, electromagnet 80 has been energized, and the magnetic flux lines have changed. Flux line 86b from permanent magnet 76 now couples magnetic flux from permanent magnet 76 into ferromagnetic mass 84. Flux line 88 from electromagnet 80 now couples magnetic flux from the electromagnet into ferromagnetic mass 84. If ferromagnetic mass 84 is coupled to an SMA material, the ferromagnetic mass and the SMA material would be attracted to permanent magnet 76, and if the magnetic gradient and stress applied to the SMA material are sufficient, a phase transformation will occur in the SMA material.

Since the magnetic flux generated by the electromagnet is usually stronger than the magnetic flux of the permanent magnet (depending on the amount of input current used to energize the electromagnet), the magnetic flux of the electromagnet will be able to overpower the magnetic flux of the permanent magnet throughout much of the yoke when the electromagnet is turned on. However the magnetic flux of the electromagnet will never be strong enough to actually flow through the permanent magnet itself. As a result, a collision of flux lines occurs at a point close to the permanent magnet. This collision results in the magnetic flux of the electromagnet being "punched out" of the iron yoke as is shown in FIG. 8B (and FIG. 7C, as discussed above). When an iron mass is in close proximity to the hybrid magnetic trigger (i.e., the electromagnet, the permanent magnet, and the iron yoke), the punched out magnetic flux will then enter and flow through the iron bar (i.e., the ferromagnetic portion of the FSMA composite plate spring, or an FSMA exhibiting both ferromagnetic and SMA properties), past the permanent magnet and back into the yoke, creating a closed loop that results in a strong attraction force. Utilizing the force generated by both the SMA and the hybrid magnets, a desired displacement between the magnetic traitor and the magnetically actuatable SMA member can be achieved.

Referring now to FIGS. 8C and 8D, the magnetic flux exhibited by a hybrid magnetic trigger 72a in the non-energized state (i.e., when the electromagnet is off) is schematically illustrated, where hybrid magnetic trigger 72a includes a permanent magnet disposed above and below electromagnet 80. A permanent magnet 77 has its poles oriented identically to permanent magnet 76. This results in a magnetic flux lines 86a (generated by permanent magnet 77) being conveyed through the yoke material in the opposite direction of the flux lines generated by permanent magnet 76. As noted above, by convention, magnetic flux is considered to flow externally from a magnet's north pole to its south pole, which means that when the electromagnet is energized as indicated in FIG. 8B, magnetic flux lines from permanent magnet 76 will be directed out of the yoke towards ferromagnetic mass 84 (as shown in FIG. 8B), but magnetic flux lines from permanent magnet 77 will remain in yoke 78 (because the magnetic flux lines from permanent magnet 77 will be in the same direction as the magnetic flux lines from the electromagnet). Reversing the flow of current used to energize the electromagnet will cause the inverse result, i.e., magnetic flux lines from permanent magnet 77 will be directed out of the yoke towards ferromagnetic mass 84a, but magnetic flux lines from permanent magnet 76 will remain in yoke 78 (because the magnetic flux lines from permanent magnet 76 will be in the same direction as the magnetic flux lines from the electromagnet). As a result, simply by changing the direction of the current used to energize an electromagnet, a single hybrid magnetic trigger can be used to separately and alternately actuate magnetically actuatable SMA members disposed proximate to the hybrid magnetic trigger. Referring back to FIG. 5, it should become clear that if hybrid magnetic triggers are used to implement magnetic triggers 40, it is possible to selectively actuate magnetically actuatable SMA springs 42a and 42b.

Note that in FIG. 8D, the pole orientations of permanent magnet 77 have been reversed. In such a configuration, which is not preferred for implementation in the linear actuators encompassed herein, energizing electromagnet 80 would result in the simultaneous attraction of ferromagnetic masses 84 and 84a. Those of ordinary skill in the art will recognize that if magnetically actuatable SMA springs 42a and 42b of FIG. 5 were to be simultaneously actuated, the desired linear motion would not be achieved.

FIGS. 8E and 8F apply this concept to the configuration of the hybrid magnetic trigger of FIG. 7A. Note that the pole orientation of permanent magnets 52a and 52b, which are disposed on opposite sides of electromagnet 54, are the same. Just as discussed above with respect to FIG. 8C, such an orientation enables a single hybrid magnetic trigger to selectively actuate magnetically actuatable SMA members disposed on opposite sides of the hybrid magnetic trigger. In FIG. 8E, the direction of the current flow used to energize electromagnet 54 results in a magnetic flux (represented by the arrow labeled H) being directed outwardly away from permanent magnets 52a, thereby actuating a magnetically actuatable SMA member disposed adjacent to permanent magnets 52a. In FIG. 8F, a direction of the current flow used to energize electromagnet 54 (opposite to that used to energize the electromagnet in FIG. 8E) results in a magnetic flux (represented by the arrow labeled H) being directed outwardly away from permanent magnets 52b, thereby actuating a magnetically actuatable SMA member disposed adjacent to permanent magnets 52b.

FIGS. 9A and 9B are enlarged views of the magnetically actuatable SMA spring of FIG. 5, illustrating how in a preferred embodiment, the magnetically actuatable SMA springs include a plurality of SMA elements. Each spring (i.e.; springs 42a and 42b) can be implemented by incorporating two NiTi springs into an iron mass 56. In an exemplary (but not limiting) embodiment, NiTi spring 58 has a diameter of about 1.2 mm and a pitch of about 25 mm, while a NiTi spring 60 has a diameter of about 1.5 mm and a pitch of about 35 mm.

FIG. 9C graphically illustrates how in one exemplary embodiment, the magnetically actuatable SMA springs of linear actuator 20a are preloaded before the actuator is assembled.

FIGS. 10A-10D are enlarged views of a portion of the linear actuator of FIG. 4, enabling details of the functioning of the actuator to be more readily observed.

Figure 10A:
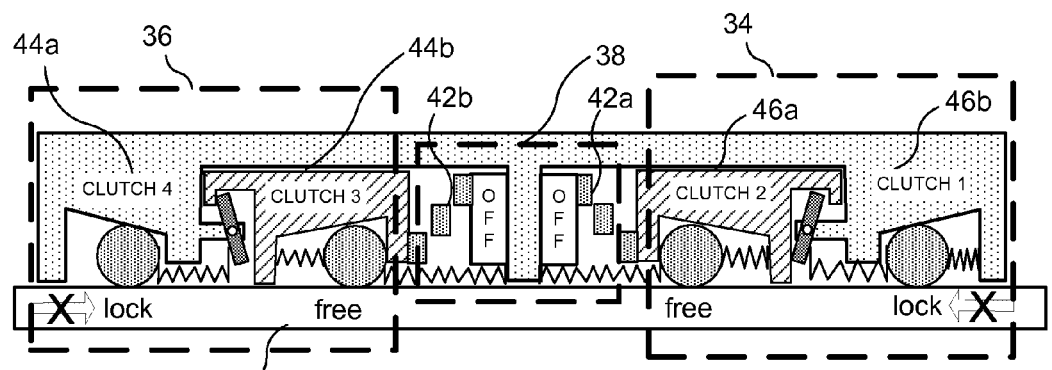

Referring to FIG. 10A, the hybrid magnetic trigger portion of actuator assembly 38 is not energized, and bar 22a is stationary, locked by both clutch assembly 34 and clutch assembly 36. Note that clutch 44a of clutch assembly 36 is responsible for preventing bar 22a from moving, while clutch 46b of clutch assembly 34 is also responsible for preventing bar 22a from moving.

Figure 10B:
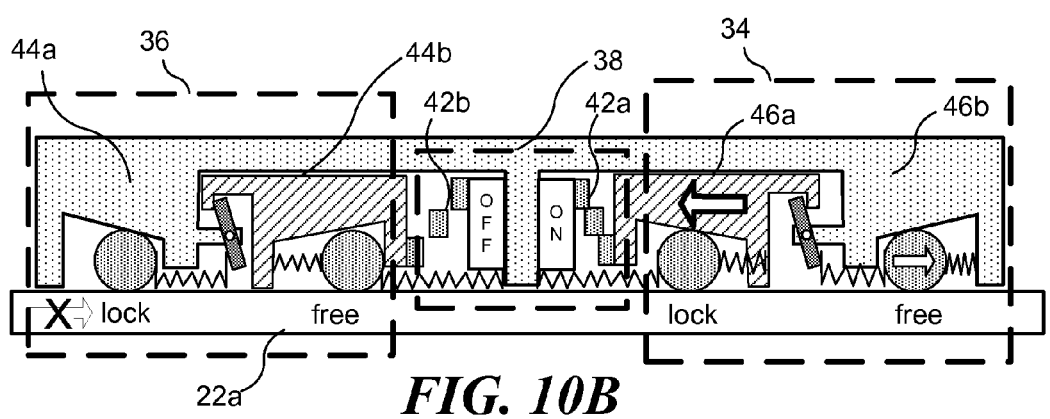

Referring to FIG. 10B, the hybrid magnetic trigger portion of actuator assembly 38 has been energized to attract spring 42a towards the hybrid magnetic trigger (i.e., to the left of the Figure). The movement of spring 42a results in clutch 46b disengaging (i.e., unlocking) bar 22a, while also causing clutch 46a to engage (i.e., to lock) bar 22a. After clutch 46a engages bar 22a, continued displacement of spring 42a to the left will cause clutch 46a and bar 22a to also move to the left (relative to the Figure). Note bar 22a is prevented from moving to the right by clutch 44a.

Figure 10C:
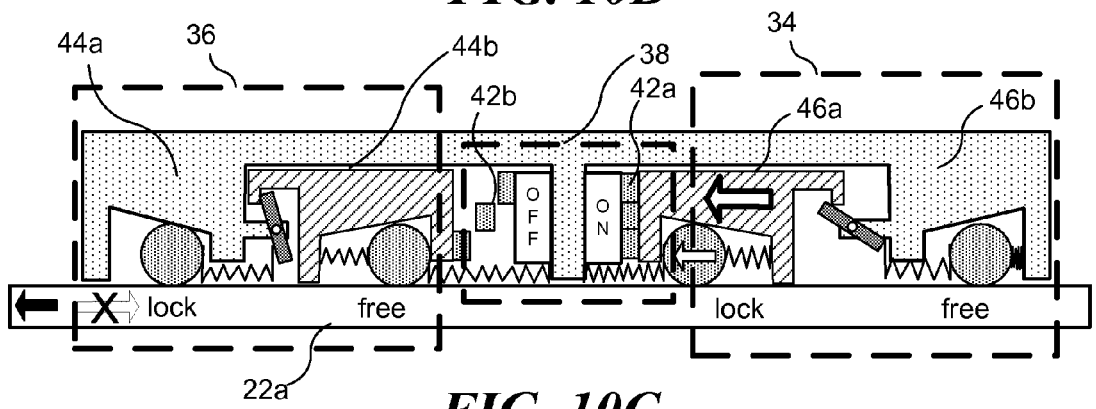

Referring to FIG. 10C, the hybrid magnetic trigger portion of actuator assembly 38 is still energized to attract spring 42a towards the hybrid magnetic trigger (i.e., to the left of the Figure), and spring 42a is collapsed to its maximum extent. As noted above, the motion of spring 42a results in a corresponding linear displacement of clutch 46a and bar 22a. Because spring 42a is completely collapsed, further energizing the electromagnet in the hybrid magnetic trigger (absent a reversal of current flow direction, as discussed below), will not result in further linear displacement of bar 22a.

Figure 10D:
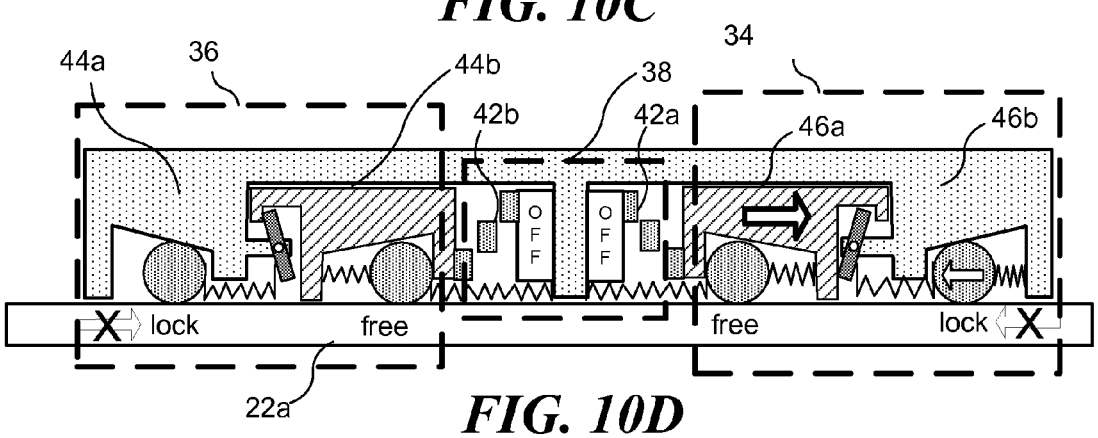

Referring to FIG. 10D, the hybrid magnetic trigger portion of actuator assembly 38 is no longer energized, and spring 42a expands to return to its original configuration. The motion of spring 42a causes clutch 46a to move towards the right (relative to the Figure), which causes clutch 46a to release (or disengage) bar 22a. Additional displacement of spring 42a to the right will cause clutch 46b to engage bar 22a, locking it in position, which returns the actuator assembly to the configuration of FIG. 10A. Additional activation of the electromagnet configured to actuate spring 42a will cause the cycle to repeat, resulting in a further linear displacement of the bar relative to the actuator assembly.

To achieve a linear displacement in the opposite direction (i.e., to move bar 22a to the right of the Figure), the direction of the current energizing the electromagnet in the hybrid magnetic trigger is reversed, such that spring 42b is attracted to the hybrid magnetic trigger. While the use of a single hybrid magnetic trigger to actuate magnetically actuatable SMA springs disposed on opposing sides of the hybrid magnetic trigger represents a preferred implementation, it should be recognized each SMA spring could be actuated by a separate magnetic trigger.

FIG. 11 graphically illustrates how the plurality of magnetic triggers shown in FIG. 5 can be selectively actuated to control a stroke of the linear actuator of FIG. 4.

A Hydraulic System Incorporating a Magnetically Actuatable SMA

FIG. 12A is an isometric view of a hydraulic system including actuators incorporating magnetically actuatable SMA membranes. A basic operational characteristic of hydraulic system 90 is magnetically actuating an SMA diaphragm. It should be understood that the terms "membrane" and "diaphragm" can be used interchangeably in the following specification. As used herein and in the claims that follow, the terms "membrane" and "diaphragm" refer to a three-dimensional mass of material characterized as having a first dimension that is substantially less than its other dimensions. Disks and sheets are common three-dimensional shapes in which a first dimension (generally referred to as thickness) is substantially less than other dimensions (such as width and length or depth). A particularly preferred three-dimensional shape for membranes/diaphragms in accord with the present invention is a disk; however, it should be understood that disks are merely exemplary of one possible shape of the membrane/diaphragm, and the novel apparatus and method is not limited in any way to membranes/diaphragms that are disk shaped.

Referring to FIG. 12A, a hydraulic system 90 includes a plurality of actuators 94 (each actuator including a plurality of magnetically actuated SMA diaphragms, described in greater detail below), a working volume 91 (i.e., a hydraulic cylinder, coupled in fluid communication with each actuator 94), a piston 92 disposed in the working volume, a fluid supply 93, a plurality of fluid lines 95 (coupling each actuator in fluid communication with the fluid supply), and a plurality of fluid lines 96 (coupling each actuator in fluid communication with the working volume). FIG. 12B is a plan view of the hydraulic system of FIG. 12A, while FIG. 12C is a side elevational view of the hydraulic system of FIG. 12A. FIG. 12D schematically illustrates exemplary dimensional details (units are in millimeters) of the hydraulic system of FIG. 12A; however, such details are intended to be exemplary, and not limiting.

Significantly, most current hydraulic systems operate using gear pumps or variable displacement pumps as actuators. While such systems are generally reliable, the size and weight of such systems generally does not facilitate implementation of compact yet powerful hydraulic systems. For example, in the logging industry, large hydraulic cranes are often used to move felled trees or logs. Such units can be impractical to maneuver in dense forests. It would be desirable to provide compact yet powerful hydraulic systems that can enable a roughly human sized hydraulic robotic system to be sufficiently powerful to move timber instead of using larger conventional hydraulic systems. The incorporation of actuators including magnetically actuated SMA membranes into hydraulic systems enables compact, yet powerful, hydraulic systems to be achieved. One advantage of a magnetically actuated SMA membrane (implemented either with an FSMA exhibiting both ferromagnetic and SMA properties, or with an FSMA composite incorporating a ferromagnetic portion and an SMA portion) is that magnetically actuated SMA membranes (such as a composite of NiTi and iron) are sufficiently flexible for use as a membrane in a diaphragm pump. Furthermore, such membranes also exhibit a high stiffness value, enabling more powerful actuators to be developed than are possible using elastomeric based membranes, such as rubber.

Empirical design studies based on hydraulic system 90 (using a NiTi/iron composite membrane) indicate that each actuator used with a hydraulic system should be able to displace a maximum load of about 250 kg. Noting that hydraulic system 90 includes 10 actuators working in parallel, hydraulic system 90 should theoretically be capable of displacing a load of about 2500 kg. Thus, hydraulic system 90 represents a very compact, yet very powerful system.

FIG. 13 schematically illustrates an actuator incorporated into the hydraulic system of FIG. 12A, enabling details of the actuator to be more readily discerned. Each actuator 94 includes two magnetically actuatable SMA membranes (membranes 98a and 98b), three hybrid magnetic triggers (triggers 40a, 40b, and 40c), and a plurality of valves 97.

FIGS. 14A-14C schematically illustrate an operational cycle of the actuators incorporated into the hydraulic system of FIG. 12A, enabling details of the functioning of the actuators to be more readily apparent.

Referring to FIG. 14A, each actuator 94 includes magnetic triggers 40a, 40b, and 40c, two magnetically actuatable SMA membranes 98a and 98b, four fluid chambers 99a, 99b, 99c, and 99d, and eight ball valves 1-8.

In FIG. 14B, when magnetic trigger 40b is activated, magnetically actuated SMA membranes 98a and 98b are attracted to magnetic trigger 40b, and each magnetically actuated SMA membrane deforms and flexes. This action causes the volume of fluid chambers 99b and 99c to decrease. Because each fluid chamber is filled with an incompressible hydraulic fluid, the fluid pressure forces valves 6 and 7 to open, allowing the hydraulic fluid to move into the hydraulic cylinder. Note that valves 1 and 4 also open, enabling fluid from the supply tank to move into the actuator to replace the fluid displaced by the actuator into the hydraulic cylinder. Fluid from the supply tank moves into chambers 99a and 99d, whose volumes increase by the same amount as the volumes of chambers 99b and 99c. While many type of valving systems are possible, the ball valve system utilized in actuator 94 is very effective, since the compression action will cause valves 2, 3, 5, and 8 to close, which prevents the hydraulic fluid from moving from the actuator back into the supply tank.

Once the full displacement of the fluid has been obtained, magnetic trigger 40b is disengaged, thereby allowing the magnetically actuatable SMA membranes (i.e., membranes 98a and 98b) to return to their original positions, as indicated in FIG. 14A. As the membranes move back to their original positions, the volume in chambers 99b and 99c increases, causing valves 2 and 3 to open, thereby allowing hydraulic oil from the supply tank to replenish the hydraulic fluid previously displaced from chambers 99b and 99c (i.e., the hydraulic fluid introduced into the hydraulic cylinder), while forcing the additional hydraulic fluid in chambers 99a and 99d into the hydraulic cylinder.

In FIG. 14C, magnetic triggers 40*a* and 40*c* are activated, and magnetically actuated SMA membrane 98*a* is attracted to magnetic trigger 40*a*, while magnetically actuated SMA membrane 98*b* is attracted to magnetic trigger 40*c*, such that each magnetically actuated SMA membrane deforms and flexes. This action causes the volume of fluid chambers 99*a* and 99*d* to decrease. Because each fluid chamber is filled with an incompressible hydraulic fluid, the fluid pressure forces valves 5 and 8 to open, allowing the hydraulic fluid to flow into the hydraulic cylinder. Note that valves 2 and 3 also open, allowing fluid from the supply tank to flow into the actuator to replace the fluid displaced by the actuator into the hydraulic cylinder. Fluid from the supply tank flows into chambers 99*b* and 99*c*, whose volumes increase by the same amount as the volumes of chambers 99*a* and 99*d* decrease.

Although the present invention has been described in connection with the preferred form of practicing it and modifications thereto, those of ordinary skill in the art will understand that many other modifications can be made to the present invention within the scope of the claims that follow. Accordingly, it is not intended that the scope of the invention in any way be limited by the above description, but instead be determined entirely by reference to the claims that follow.

The invention in which an exclusive right is claimed is defined by the following:

1. A linear actuator comprising a shaft and an actuator assembly configured to enable relative movement to occur between the shaft and the actuator assembly, the actuator assembly comprising:
    (a) a member configured to be magnetically actuated, actuation of the member causing the member to move from a first position to a second position, where the second position is closer to a magnetic field than the first position, the member comprising a shape memory alloy, such that when the shape memory alloy moves to the second position, a stress is applied to the shape memory alloy, and that stress, in combination with the shape memory alloy being exposed to a greater magnetic flux by virtue of being closer in proximity to the magnetic field in the second position as compared to the first position, causes a phase change in the shape memory alloy, from an initial relatively stiff austenitic state to a relatively softer martensitic state, the phase change resulting from a hybrid mechanism requiring both an applied stress and an exposure to a sufficiently strong magnetic field; and
    (b) a magnetic trigger configured to selectively actuate the member, the magnetic trigger controlling the magnetic field associated with the movement of the member to the second position.

2. The linear actuator of claim 1, wherein the shape memory alloy comprises a ferromagnetic shape memory alloy.

3. The linear actuator of claim 1, wherein the shape memory alloy is super elastic, and the member is configured so that when an intensity of the magnetic field is reduced to a level insufficient to actuate the member, the member automatically returns to the first position.

4. The linear actuator of claim 1, wherein the member further comprises a ferromagnetic mass coupled with the shape memory alloy such that the ferromagnetic mass and the shape memory alloy move together, the ferromagnetic mass being attracted to the magnetic trigger when the magnetic trigger is activated.

5. The linear actuator of claim 4, wherein the shape memory alloy comprises super elastic nickel titanium (NiTi) alloy.

6. The linear actuator of claim 1, wherein the magnetic trigger comprises a hybrid magnetic trigger including at least one permanent magnet and at least one electromagnet.

7. The linear actuator of claim 1, farther comprising a plurality of teeth movably mounted on the shaft and configured to control a direction of the relative movement between the shaft and the actuator assembly.

8. The linear actuator of claim 1, wherein the actuator assembly further comprises a plurality of clutches that control a direction of the relative movement between the shaft and the actuator assembly.

9. The linear actuator of claim 1, wherein the actuator assembly further comprises a second member configured to be magnetically actuated, the second member being disposed such that the member and the second member can be selectively actuated by the magnetic trigger, actuation of the member resulting in relative movement between the shaft and the actuator assembly in a first direction, and actuation of the second member resulting in relative movement between the shaft and the actuator assembly in a second direction.

10. The linear actuator of claim 9, wherein the actuator assembly further comprises additional magnetic triggers, such that the actuator assembly includes a plurality of magnetic triggers, each additional magnetic trigger being configured to selectively actuate the member and the second member, such that selective control of the plurality of magnetic triggers enables a stroke of the linear actuator to be controlled.

11. The linear actuator of claim 10, wherein the plurality of magnetic triggers are disposed between the member and the second member.

12. The linear actuator of claim 1, wherein the member comprises a first shape memory alloy coil spring, a second shape memory alloy coil spring, and a ferromagnetic mass, each shape memory alloy coil spnng being embedded in the ferromagnetic mass, such that each shape memory alloy coil spring and the ferromagnetic mass move as a single unit when the magnetic trigger is activated.

13. The linear actuator of claim 1, wherein the member is preloaded during assembly, such that the first position is associated with a preloaded state.

14. The linear actuator of claim 1, wherein the actuator assembly further comprises a second member configured to be magnetically actuated, and a second magnetic trigger configured to selectively actuate the second member, such that the actuation of the member by the magnetic trigger results in relative movement between the shaft and the actuator assembly in a first direction, and actuation of the second member by the second magnetic trigger results in relative movement between the shaft and the actuator assembly in a second direction.

15. A method for achieving a linear motion relative to a first member and a second member, comprising the steps of:
    (a) selectively securing at least a portion of the second member to the first member;
    (b) using a magnetic force to attract a magnetically actuatable portion of the second member to a magnetic portion of the second member, such that a distance separating the magnetically actuatable portion of the second member and the magnetic portion of the second member decreases, the magnetically actuatable portion of the second member comprising a shape memory alloy, a movement of the shape memory alloy from a first position to a second position applying a stress to the shape memory alloy, the stress and exposure to a magnetic field produced by the magnetic portion inducing a phase change in the shape memory alloy, the phase change occurring after the shape memory alloy begins to move in response to the magnetic force, the phase change comprising a change from an initial relatively stiff austenitic state to a relatively softer martensitic state, the shape memory alloy comprising at least one of:
  (i) a ferromagnetic shape memory alloy; and
  (ii) a ferromagnetic mass coupled to a shape memory alloy; and
(c) interrupting the magnetic force attracting the magnetically actuatable portion of the second member to the magnetic portion of the second member, such that the distance separating the magnetically actuatable portion of the second member and the magnetic portion of the second member increases, the linear motion relative to the first member and the second member being achieved during at least one of the following:
  (i) while the distance separating the magnetically actuatable portion of the second member and the magnetic portion of the second member is decreasing; and
  (ii) while the distance separating the magnetically actuatable portion of the second member and the magnetic portion of the second member is increasing.

16. The linear actuator of claim 1, wherein movement of the member from the first position to the second position results in relative movement between the shaft and the actuator assembly.

17. The linear actuator of claim 1, wherein movement of the member from the second position to the first position results in relative movement between the shaft and the actuator assembly.

18. The method of claim 15, wherein:
(a) the step of using a magnetic force to attract the magnetically actuatable portion of the second member to the magnetic portion of the second member comprises the step of energizing an electromagnet; and
(b) the step of interrupting the magnetic force attracting the magnetically actuatable portion of the second member to the magnetic portion of the second member comprises the step of de-energizing the electromagnet.

19. A linear actuator comprising:
(a) a shaft; and
(b) an actuator assembly, actuation of the linear actuator resulting in a relative movement between the shaft and the actuator assembly, the shaft and actuator assembly being sized such that a linear extent of the shaft is greater than a linear extent of the actuator assembly, the shaft and actuator assembly being oriented such that the shaft extends throughout an inner volume of the actuator assembly and passes beyond at least one of a first end and a second end of the actuator assembly, the actuator assembly comprising:
  (i) a member configured to be magnetically actuated with a magnetic field, actuation of the member causing the member to move from a first position to a second position, where the second position is closer to the magnetic field than the first position, the member comprising a shape memory alloy; and
  (ii) a magnetic trigger configured to selectively actuate the member, the magnetic trigger controlling the magnetic field associated with the movement of the member to the second position.

20. A linear actuator comprising a shaft and an actuator assembly configured to enable relative movement to occur between the shaft and the actuator assembly, the actuator assembly comprising:
(a) a member configured to be magnetically actuated, actuation of the member causing the member to move from a first position to a second position, where the second position is closer to a magnetic field than the first position, the member comprising a shape memory alloy; and
(b) a magnetic trigger configured to selectively actuate the member, the magnetic trigger controlling the magnetic field associated with the movement of the member to the second position, a movement of the member from a first position to a second position applying a stress to the shape memory alloy, the stress and exposure to a magnetic field produced by the magnetic trigger inducing a phase change in the shape memory alloy, from an initial relatively stiff austenitic state to a relatively softer martensitic state.

21. A method for achieving a linear motion relative to a first member and a second member, comprising the steps of:
(a) selectively securing at least a portion of the second member to the first member;
(b) using a magnetic force to attract a magnetically actuatable portion of the second member to a magnetic portion of the second member, such that a distance separating the magnetically actuatable portion of the second member and the magnetic portion of the second member decreases, a movement of the magnetically actuatable portion of the second member from a first position to a second position applying a stress to a shape memory alloy portion of the second member, the stress and exposure to a magnetic field inducing a phase change in the shape memory alloy from an initial relatively stiff austenitic state to a relatively softer martensitic state, the shape memory alloy portion of the second member comprising at least one of:
  (i) a ferromagnetic shape memory alloy; and
  (ii) a ferromagnetic mass coupled to a shape memory alloy; and
(c) interrupting the magnetic force attracting the magnetically actuatable portion of the second member to the magnetic portion of the second member, such that the distance separating the magnetically actuatable portion of the second member and the magnetic portion of the second member increases, the linear motion relative to the first member and the second member being achieved during at least one of the following:
  (i) while the distance separating the magnetically actuatable portion of the second member and the magnetic portion of the second member is decreasing; and
  (ii) while the distance separating the magnetically actuatable portion of the second member and the magnetic portion of the second member is increasing.

22. A linear actuator comprising a shaft and an actuator assembly configured to enable relative movement to occur between the shaft and the actuator assembly, the actuator assembly comprising:
(a) a member configured to be magnetically actuated, actuation of the member causing the member to move from a first position to a second position, where the second position is closer to a magnetic field than the first position, the member comprising a shape memory alloy, wherein movement of the member from the first position to the second position is not due to a Martensite variant rearrangement; and
(b) a magnetic trigger configured to selectively actuate the member, the magnetic trigger controlling the magnetic field associated with the movement of the member to the second position.

* * * * *